(12) United States Patent
Leizerovich

(10) Patent No.: US 12,360,178 B2
(45) Date of Patent: Jul. 15, 2025

(54) SYSTEM AND METHOD FOR DETECTING FAULTS IN POWER TRANSMISSION SYSTEMS USING OSCILLOGRAPHY

(71) Applicant: UBICQUIA, INC., Fort Lauderdale, FL (US)

(72) Inventor: Gustavo Dario Leizerovich, Aventura, FL (US)

( * ) Notice: Subject to any disclaimer, the term of this patent is extended or adjusted under 35 U.S.C. 154(b) by 194 days.

(21) Appl. No.: 18/241,148

(22) Filed: Aug. 31, 2023

(65) Prior Publication Data

US 2024/0069121 A1 Feb. 29, 2024

Related U.S. Application Data

(63) Continuation-in-part of application No. 18/240,317, filed on Aug. 30, 2023.

(60) Provisional application No. 63/405,384, filed on Sep. 9, 2022, provisional application No. 63/405,382, filed on Sep. 9, 2022, provisional application No. 63/402,933, filed on Aug. 31, 2022.

(51) Int. Cl.
*G01R 31/62* (2020.01)
*G01R 15/18* (2006.01)
*G01R 19/25* (2006.01)

(52) U.S. Cl.
CPC .......... *G01R 31/62* (2020.01); *G01R 15/181* (2013.01); *G01R 19/2513* (2013.01)

(58) Field of Classification Search
CPC ... G01R 31/62; G01R 15/181; G01R 19/2513
USPC ................................. 324/547, 546, 537, 500
See application file for complete search history.

(56) References Cited

U.S. PATENT DOCUMENTS

2007/0136010 A1* 6/2007 Gunn .................. G01R 15/185
702/62
2011/0184671 A1 7/2011 Abiprojo et al.
(Continued)

OTHER PUBLICATIONS

U.S. Patent & Trademark Office as International Searching Authority, International Search Report in connection with counterpart International Application No. PCT/US2023/031770, Jan. 26, 2024, 2 pages.

(Continued)

*Primary Examiner* — Giovanni Astacio-Oquendo
(74) *Attorney, Agent, or Firm* — Daniel C. Crilly

(57) ABSTRACT

A system for detecting a fault in a distribution transformer of a power transmission system includes a current sensor and one or more processors. The current sensor may be positioned to sense a primary output current or a secondary output current flowing from the distribution transformer. The processor may be programmed or otherwise operable to receive an output of the current sensor over time, generate a time-varying output signal representing the received output of the current sensor, compare the time-varying output signal to one or more transformer fault profiles to produce a fault analysis, and generate a fault alert when the fault analysis indicates a transformer fault condition. The current sensor may be positioned around a primary output terminal or a secondary output terminal of the distribution transformer, as applicable, to respectively sense either the primary output current or the secondary output current flowing from the distribution transformer.

17 Claims, 12 Drawing Sheets

(56) References Cited

U.S. PATENT DOCUMENTS

| | | | |
|---|---|---|---|
| 2015/0377930 A1* | 12/2015 | Youn | H01H 71/125 |
| | | | 361/87 |
| 2018/0252758 A1* | 9/2018 | Turner | G01R 19/16538 |
| 2019/0383864 A1 | 12/2019 | Joshi et al. | |
| 2021/0215772 A1 | 7/2021 | Mauney | |
| 2022/0223338 A1 | 7/2022 | Reed et al. | |

OTHER PUBLICATIONS

U.S. Patent & Trademark Office as International Searching Authority, Written Opinion of the International Searching Authority in connection with counterpart International Application No. PCT/US2023/031770, Jan. 26, 2024, 7 pages.

* cited by examiner

SYSTEM AND METHOD FOR DETECTING FAULTS IN POWER TRANSMISSION SYSTEMS USING OSCILLOGRAPHY

CROSS-REFERENCE TO RELATED APPLICATIONS

The present application is a continuation-in-part of U.S. application Ser. No. 18/240,317, which was filed on Aug. 30, 2023, and is incorporated herein by this reference as if fully set forth herein. The present application claims the benefit of and priority upon U.S. Provisional Patent Application No. 63/402,933, which was filed on Aug. 31, 2022, and is incorporated herein by this reference as if fully set forth herein. The present application also claims the benefit of and priority upon U.S. Provisional Patent Application No. 63/405,382, which was filed on Sep. 9, 2022, and is incorporated herein by this reference as if fully set forth herein. The present application further claims the benefit of and priority upon U.S. Provisional Patent Application No. 63/405,384, which was filed on Sep. 9, 2022, and is incorporated herein by this reference as if fully set forth herein.

TECHNICAL FIELD

The present disclosure generally relates to fault detection methods and systems in transformers or power transmission systems. More particularly, but not exclusively, the present disclosure relates to use of current sensors and oscillography to isolate and/or analyze faults in transformers or power transmission systems.

BACKGROUND

Distribution transformers are parts of the power system infrastructure. The power system infrastructure includes power lines, transformers and other devices for power generation, power transmission, and power delivery. A power source generates power, which is transmitted along high voltage (HV) power lines for long distances. Typical voltages found on HV transmission lines range from 69 kilovolts (kV) to in excess of 800 kV. The power signals are stepped down to medium voltage (MV) power and then stepped down further to low voltage (LV) levels at distribution transformers. LV power lines typically carry power signals having voltages ranging from about 100 V to about 600 V to customer premises.

In the United States local distribution transformers typically feed anywhere from one to ten homes, depending upon the concentration of the customer premises in a particular area. A power distribution system for a given area may include many distribution transformers. Thus, the replacement costs and maintenance costs for distribution transformers can be a significant factor in the cost of power distribution.

A number of factors adversely affect the life and operation of a distribution transformer. A distribution transformer is rated to handle power signals within a given power range and at other parameters within certain parameter ranges. Overloading a given distribution transformer may reduce the useful life of the transformer. In particular, an overload increases the temperature of the transformer windings, which in turn increases the temperature of the transformer insulation. A breakdown of the transformer's insulation, such as from the increased temperature, decreases the useful life of the transformer and increases the chances of a transformer failure. In fact, the cause of most transformer failures is a breakdown of the insulation, so anything that adversely affects the insulating properties inside the transformer reduces transformer life. Overloading a distribution transformer is one of the prime causes of insulation breakdown. In brief, loading a transformer over its rating for an extended period of time or at multiples of its nameplate rating for a brief period of time will reduce the transformer's life expectancy.

One challenge to the efficient maintenance of a distribution transformer is that an overload cannot be detected and monitored directly. An overload may be inferred from load flow models. Commonly however, it is when the transformer fails that an overload condition is specifically identified. Further, there are many different sized transformers (with correspondingly different power ratings) in a power distribution system. However, the specific size and rating of a specific transformer is not directly monitored. Instead, the transformer size and rating are typically inferred based on statistical usage information.

SUMMARY

In some embodiments, a system for detecting a fault in a power transmission system having multiple distribution transformers configured in a loop includes a first current sensor, such as a Rogowski coil, positioned to sense a primary input current to a distribution transformer, a second current sensor positioned to sense a primary output current from the distribution transformer, and one or more processors coupled to the current sensors. The processor(s) may be configured to receive signals representing outputs of the two current sensors, determine a value representing a current (e.g., an estimated current) flowing in the primary winding of the distribution transformer based on the received signals, and generate an alert when the determined value is outside of a desired range of values. Each current sensor may be coupled to one or more local processors or data generated from the outputs of multiple current sensors may be communicated to a central processor, such as a remote server or processing system. The primary winding current for the distribution transformer may be determined as the difference between the sensed primary input current to the distribution transformer and the sensed primary output current from the distribution transformer. The value determined by the processor(s) based on the signals received from the current sensors may represent such differential current.

For purposes of sensing the primary input current to the subject distribution transformer, the first current sensor may be positioned (a) around a conductor carrying the primary input current to the distribution transformer, (b) at or around the distribution transformer's primary input terminal, or (c) at or around another distribution transformer's primary output terminal, where the primary output terminal of the other distribution transformer is electrically in series with the primary input terminal of the subject distribution transformer. For purposes of sensing the primary output current from the subject distribution transformer, the second current sensor may be positioned (a) around a conductor carrying the primary output current from the distribution transformer, (b) at or around a primary output terminal of the distribution transformer, or (c) at or around a primary input terminal of another distribution transformer, where the primary input terminal of the other distribution transformer is electrically in series with the primary output terminal of the subject distribution transformer. The terms "primary input terminal" and "primary output terminal," as used in the specification and the appended claims, shall encompass and include "terminals" and "bushings" as such terms are used in the power transmission field.

In some embodiments, the system further includes a third current sensor positioned to sense a primary input current to another (e.g., a second) distribution transformer and a fourth current sensor positioned to sense a primary output current of the second distribution transformer. According to this embodiment, the processor(s) further determines a value representing a current flowing in a primary winding of the second distribution transformer based on signals representing outputs of the third and fourth current sensors and generates an alert when the value representing the primary winding current of the first distribution transformer or the value representing the primary winding current of the second distribution transformer is outside a respective desired range of values. In some embodiments, the current sensors are coupled to at least one high speed analog-to-digital converter (ADC) and the ADC is coupled to the one or more processors, where the one or more processors determine one or more root mean square (RMS) values of voltage, current, and/or active, reactive, or apparent power and energies. In some embodiments, the current sensors are coupled to at least one high speed ADC and the ADC is coupled to the one or more processors, where the one or more processors determine instantaneous primary winding currents or generate output data from which such current determinations may be made.

In some embodiments, one or more wireless transmitters are coupled to the one or more processors and transmit data output from the processors representing current sensor outputs and/or determined primary winding currents for the monitored distribution transformers. The transmitters may also transmit alerts output by the processors to a remote server.

In some embodiments, each current sensor generates a respective voltage that is proportional to the rate of change of a current flowing through a conductor around which the current sensor is positioned.

In some embodiments, the system generates an alert when the calculated first current or the calculated second current is beyond a predetermined windowed value to isolate a fault to at least one transformer among the plurality of transformers in the loop.

In some embodiments, the system further includes an accelerometer coupled to the one or more processors for detection of movement of the first transformer or the second transformer. In some embodiments, the system further includes a thermal sensor coupled to the first transformer or the second transformer or both. In some embodiments, the system further includes a global positioning system receiver coupled to the first transformer or the second transformer or both. In some embodiments, the system forms a portion of a distribution transformer monitor (DTM) for a pad-mounted transformer.

In some embodiments, a system for detecting a fault in a power transmission system including multiple distribution transformers in a loop configuration includes a first current sensor placed around a conductor for a primary input to a high voltage side of a first transformer, a second current sensor placed around a conductor for a primary output on the high voltage side to the first transformer, a third current sensor placed around a conductor for a primary input to a high voltage side of a second transformer, a fourth current sensor placed around a conductor for a primary output on the high voltage side to the second transformer, and one or more processors coupled to the first current sensor, the second current sensor, the third current sensor, and the fourth current sensor. The one or more processors can be programmed or configured to perform the functions of calculating a primary winding current for the first transformer using the first and second current sensors to provide a calculated first current, calculating a primary winding current for the second transformer using the third and fourth current sensors to provide a calculated second current, and generating an alert when the calculated first current or the calculated second current are outside a desired range. In some embodiments, the system forms a portion of a distribution transformer monitor.

In some embodiments, the system further includes one or more wireless transmitters coupled to the one or more processors for transmitting the calculated first current, the calculated second current, or the alert to a remote server. In some embodiments, the system further includes an accelerometer coupled to the one or more processors for detection of movement of the first transformer or the second transformer. In some embodiments, the system further includes a thermal sensor coupled to the first transformer or the second transformer or both. In some embodiments, the system further includes a global positioning system receiver coupled to the first transformer or the second transformer or both.

In some embodiments, the first, second, third, and fourth current sensors generate respective voltages which are proportional to a rate of change of a current flowing through the respective conductor that the current sensor resides around.

In some embodiments, the system generates the alert when the calculated first current or the calculated second current is outside its desired range to isolate a fault to at least one transformer among the plurality of transformers.

In some embodiments, a system for detecting a fault in a power transmission system containing multiple distribution transformers in a loop configuration includes a first current sensor placed around a conductor for a primary input to each of a high voltage side of one or more transformers among a plurality of transformers, a second current sensor placed around a conductor for a primary output of a high voltage side to each of one or more corresponding transformers among the plurality of transformers, and one or more processors coupled to the corresponding first current sensor and the second current sensor. The one or more processors can be configured or programmed to perform the functions of calculating a value representing a primary winding current for a first transformer of the plurality of transformers using the first and second current sensors to provide a first calculated value, calculating a value representing a primary winding current for a second transformer of the plurality of transformers using another corresponding first and second current sensors to provide a second calculated value, and generating an alert when the first calculated value or the second calculated value is outside a respective desired range.

In further embodiments, a processor may perform a method for detecting a fault in a power transmission system having multiple distribution transformers in a loop configuration. The processor may be a processor forming part of a distribution transformer monitor installed at or near one of the distribution transformers configured in the loop. Alternatively or additionally, the processor may be part of a remote computing device, such as a cloud server, in communication with distribution transformer monitors or other sensors installed at or near the distribution transformers in the loop.

In accordance with the exemplary method, the processor receives a first signal representing an output of a first current sensor positioned to sense a primary current entering a distribution transformer. The first current sensor may be positioned at or near the primary input of the distribution transformer (e.g., at the primary input bushing/terminal) or may be positioned at or near the primary output of another distribution transformer (e.g., at the primary output bushing/terminal), which has its primary output electrically in series with the primary input of the subject distribution transformer. Further, the first current sensor may be positioned at a location along the primary power conductor before the primary conductor enters the subject distribution transformer.

The processor also receives a second signal representing an output of a second current sensor positioned to sense a primary current exiting the subject distribution transformer. Analogous to the locations of the first current sensor, the second current sensor may be positioned at or near the primary output of the distribution transformer (e.g., at the primary output terminal) or may be positioned at or near the primary input of another distribution transformer (e.g., at the primary input terminal), which has its primary input electrically in series with the primary output of the subject distribution transformer. Further, the second current sensor may be positioned at a location along the primary power conductor after the primary conductor exits the subject distribution transformer but before the primary conductor enters another distribution transformer in the loop.

After receiving the two signals, the processor determines a value representing a current in a primary winding of the distribution transformer based on the two signals. The processor may also determine a first current based on the first signal (e.g., the primary conductor current, if any, entering the first distribution transformer) and a second current based on the second signal (e.g., the primary conductor current, if any, exiting the first distribution transformer). The processor may further determine a current in the primary winding of the distribution transformer based on the two determined currents. For example, the primary winding current of the distribution transformer may be the difference between the first determined current (current entering the primary input terminal of the distribution transformer) and the second determined current (current exiting the primary output terminal of the distribution transformer). The processor generates an alert when the determined value is outside a desired range of values (e.g., when the determined primary winding current value is more than or less than a current value in its desired range).

The current sensors may be standalone sensors with their own communication capabilities (e.g., wireless communication capabilities) or they may be part of one or more distribution transformer monitors. For example, where the first current sensor is mounted to a primary input terminal of the distribution transformer and the second current sensor is mounted to a primary output terminal of the distribution transformer, the current sensors may form part of a distribution transformer monitor located at or near the subject distribution transformer. Alternatively, where the first current sensor is mounted to a primary input terminal of the distribution transformer and the second current sensor is mounted to a primary input terminal of another distribution transformer that is electrically in series with the primary output of the subject distribution transformer, the first current sensor may form part of a first distribution transformer monitor located at or near the subject distribution transformer and the second current sensor may form part of a second distribution transformer monitor located at or near the other distribution transformer.

The alert communicated by the processor may provide a target of the alert an identifier for the faulty distribution transformer and optionally one or more of the determined value for the faulty transformer's primary winding and one or more of any determined current values (e.g., primary input current, primary output current, and/or primary winding current) to enable the alert target to determine which distribution transformer caused a loop current fault. The alert may also include additional information, such as GPS location of the faulty distribution transformer and other parameter data for the faulty distribution transformer as detected by other sensors at the distribution transformer.

In alternative embodiments, a system for detecting a current fault in a power transmission system including distribution transformers in a loop configuration may include a current sensor and one or more processors. In these embodiments, the current sensor may be positioned to concurrently sense a primary input current to and a primary output current from a distribution transformer. Thus, the current sensor may generate a voltage that is proportional to the rate of change of the current flowing in the primary winding of the distribution transformer. In other words, the current sensor may effectively and directly sense the differential current flowing in the primary winding of the distribution transformer. The current flowing in the primary winding of the distribution transformer is a difference between the primary input current and the primary output current. The one or more processors are operable to receive a signal representing an output of the current sensor, determine a value representing a current flowing in the primary winding of the distribution transformer based on the received signal, and generate an alert when the determined value is outside a desired range of values. In one embodiment, the current sensor is a single Rogowski coil, which may be positioned concurrently around a primary input terminal and a primary output terminal of the distribution transformer.

The fault detection system may further include an analog-to-digital converter operably positioned between the current sensor and the one or more processors. In this embodiment, the analog-to-digital converter converts an analog output of the current sensor into the signal received by the one or more processors, wherein the signal is in digital form. Additionally or alternatively, the fault detection system may also include a wireless transmitter operably coupled to the one or more processors for transmitting data representing at least one of the signal and the alert to a remote server (e.g., a cloud server) or other remote computing device. In a further embodiment, one or more of the processors may form part of the remote server to which the signal was communicated, wherein the processor(s) at the server is operable to receive the signal, determine the value associated with the primary winding current, and generate the alert when the value is outside the desired range of values. In one or more additional or alternative embodiments, the current sensor and a processor of the one or more processors may form part of a distribution transformer monitor, which may be positioned at the distribution transformer. In these embodiments, the processor may be operable to receive the signal, determine the value associated with the primary winding current, and generate the alert when the value is outside the desired range of values.

In one or more additional or alternative embodiments, the fault detection system may further include a second current sensor positioned to concurrently sense a primary input current to and a primary output current from a second distribution transformer in the power transmission system.

In such an embodiment, the fault detection system processor(s) may receive a second signal representing an output of the second current sensor, determine a second value representing a current flowing in a primary winding of the second distribution transformer based on the received second signal, and generate a second alert when the second value is outside a second desired range of values. In one or more additional or alternative embodiments involving use of the second current sensor, the second current sensor and a processor of the one or more processors may form part of a distribution transformer monitor positioned at the second distribution transformer, in which case the processor may be operable to receive the second signal, determine the second value associated with the primary winding current of the second distribution transformer, and generate the alert when the second value is outside the second desired range of values.

In one or more additional or alternative embodiments, an apparatus for detecting a current fault in a power transmission system including distribution transformers in a loop configuration may include a current sensor positioned to concurrently sense a primary input current to and a primary output current from a distribution transformer and a processor operable to receive a signal representing an output of the current sensor, determine a value representing a current flowing in a primary winding of the distribution transformer based on the received signal, and generate an alert when the value is outside a desired range of values. In one exemplary embodiment, the current sensor may be positioned concurrently around a primary input terminal and a primary output terminal of the distribution transformer. The fault detection apparatus may form all or part of a distribution transformer monitor, and the current sensor may be a single Rogowski coil or may otherwise generate a voltage that is proportional to a rate of change of the current flowing in the primary winding of the distribution transformer, wherein the current flowing in the primary winding of the distribution transformer is a difference between the primary input current and the primary output current.

In one or more additional or alternative embodiments, the fault detection apparatus may also include an analog-to-digital converter operably positioned between the current sensor and the processor, where the analog-to-digital converter converts an analog output of the current sensor into the signal associated with the primary winding current as received by the processor, wherein the signal is in digital form. The fault detection apparatus may further include a wireless transmitter coupled to the processor for transmitting at least the alert to a remote server, such as a cloud server or other remote computing device or system.

In additional or alternative embodiments, a processor may perform a method for detecting a fault in a power transmission system having multiple distribution transformers in a loop configuration. The processor may be a processor forming part of a distribution transformer monitor installed at or near one of the distribution transformers configured in the loop. Alternatively or additionally, the processor may be part of a remote computing device, such as a cloud server, in communication with distribution transformer monitors or other sensors installed at or near the distribution transformers in the loop.

In accordance with the exemplary method, the processor receives a signal representing an output of a current sensor positioned to concurrently sense a primary current entering a distribution transformer of the power transmission system and a primary current exiting the distribution transformer. The processor determines a value representing a current flowing in a primary winding of the distribution transformer based on the received signal and generates an alert when the determined value is outside a desired range of values. Additionally or alternatively, at least the current sensor may form part of a distribution transformer monitor positioned at the distribution transformer. Further, the current sensor may be positioned concurrently around a primary input terminal and a primary output terminal of the distribution transformer.

In additional or alternative embodiments, the processor (e.g., when forming part of a remote server) may receive a second signal representing an output of a second current sensor positioned to concurrently sense a primary current entering a second distribution transformer of the power transmission system and a primary current exiting the second distribution transformer. In such a case, the processor may also determine a second value representing a current flowing in a primary winding of the second distribution transformer based on the received second signal and generate a second alert when the second value is outside a second desired range of values. Each distribution transformer of the power transmission system may be equipped with at least a current sensor positioned to concurrently sense a primary input current and a primary output current for the distribution transformer, as well as other optional components, such as a wireless transmitter or transceiver, to provide a signal representing the differential current value to a processor, which may be located in a remote server or computing device or in one of the distribution transformer monitors installed at distribution transformers in the power transmission system. The processor is then capable of generating and sending an alert identifying a faulty transformer when the differential current value is outside a desired range of values. Other sensors at the distribution transformers, which may or may not be part of installed distribution transformer monitors, may also be used to provide further information, such as geolocations, from which to identify faulty distribution transformers.

In alternative embodiments, a system for detecting a fault in a distribution transformer of a power transmission system may include a current sensor and one or more processors. In these embodiments, the current sensor may be positioned to sense a primary output current flowing from the distribution transformer. For example, the current sensor may be positioned around a primary output terminal of the distribution transformer. The processor may be operable to receive an output of the current sensor over time, generate a time-varying output signal representing the received output of the current sensor, compare at least the time-varying output signal to one or more transformer fault profiles to produce a fault analysis, and generate an alert when the fault analysis indicates a transformer fault condition. The fault detection system may also include an analog-to-digital converter operably positioned between the current sensor and the processor. The analog-to-digital converter may convert an analog output of the current sensor to the output of the current sensor received by the processor, wherein the output of the current sensor received by the processor is in digital form. The fault detection system may further include a wireless transmitter operably coupled to the processor for transmitting at least one of the time-varying output signal and the alert to a remote processing system, such as a remote server (e.g., a cloud server).

In other alternative embodiments, a system for detecting a fault in a distribution transformer of a power transmission system includes first current sensor positioned to sense a primary output current flowing from the distribution transformer, at least a second current sensor positioned to sense at least one secondary output current flowing from the distribution transformer, and one or more processors. The processor(s) is operable to receive an output of the first current sensor over time, receive an output of the second current sensor over time, generate a first time-varying output signal representing the received output of the first current sensor, generate a second time-varying output signal representing the received output of the second current sensor, compare at least the first time-varying output signal to a first set of transformer fault profiles to produce a first fault analysis, compare at least the second time-varying output signal to a second set of transformer fault profiles to produce a second fault analysis, generate a first alert when the first fault analysis indicates a transformer fault condition related to a primary side of the distribution transformer, and generate a second alert when the second fault analysis indicates a transformer fault condition related to a secondary side of the distribution transformer. The fault detection system may also include one or more wireless transmitters coupled to the processor(s) for transmitting at least one of the first time-varying output signal, the second time-varying output signal, the first alert, and the second alert to a remote processing system, such as a cloud server.

For the purpose of sensing the primary output current flowing from the distribution transformer, the first current sensor may be positioned around a primary output terminal of the distribution transformer. Similarly, for the purpose of sensing the secondary output current flowing from the distribution transformer, the second current sensor may be positioned around a secondary output terminal of the distribution transformer. Each current sensor may be a Rogowski coil.

In further alternative embodiments of the present disclosure, a processor may perform a method for detecting a fault in a distribution transformer of a power transmission system. The processor may be a processor forming part of a distribution transformer monitor installed at or near one of the distribution transformers of the power transmission system. Alternatively or additionally, the processor may be part of a remote computing device or system, such as a cloud server, in communication with distribution transformer monitors or other sensors installed at or near the distribution transformers in the power transmission system.

In accordance with the exemplary method, the processor receives an output of a current sensor over time, where the current sensor is positioned to sense one of a primary output current flowing from the distribution transformer and a secondary output current flowing from the distribution transformer. The processor generates a time-varying output signal representing the received output of the current sensor, compares the time-varying output signal to one or more transformer fault profiles to produce a fault analysis, and generates an alert when the fault analysis indicates a transformer fault condition. The processor may communicate the alert over a communication network to a remote server or other processing system. Additionally, the processor may communicate the time-varying output signal to the remote processing system for generation and display of a waveform on a computer display, wherein the waveform corresponds to the time-varying output signal.

According to an exemplary embodiment in which the current sensor is positioned to sense the primary output current flowing from the distribution transformer, the processor may further receive an output of a second current sensor over time, where the second current sensor is positioned to sense the secondary output current flowing from the distribution transformer. In this case, the processor may generate a second time-varying output signal representing the received output of the second current sensor, compare the second time-varying output signal to a set of transformer fault profiles corresponding to faults detectable on a secondary side of the distribution transformer to produce a second fault analysis, and generate a second alert when the second fault analysis indicates a secondary side transformer fault condition.

According to another exemplary embodiment in which the current sensor is positioned to sense the primary output current flowing from the distribution transformer, the one or more transformer fault profiles includes a set of transformer fault profiles corresponding to faults detectable on a primary output side of the distribution transformer, and the alert is generated when the fault analysis indicates a primary side transformer fault condition. In any of foregoing exemplary embodiments, when the current sensor is positioned to sense the primary output current flowing from the distribution transformer, the current sensor may be positioned around a primary output terminal of the distribution transformer. Similarly, when the current sensor is positioned to sense the secondary output current flowing from the distribution transformer, the current sensor may be positioned around a secondary output terminal of the distribution transformer.

BRIEF DESCRIPTION OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. Also in these instances, well-known structures may be omitted or shown and described in reduced detail to avoid unnecessarily obscuring descriptions of the embodiments.

Referring to FIGS. 1-11, various views of an exemplary current sensor implemented or used along with a power transmission system forms a part of an apparatus or system for detecting faults within the power transmission system. More particularly, such a system can detect loop current faults or other anomalies based on signals derived from the current sensor or coils.

Figure 1:
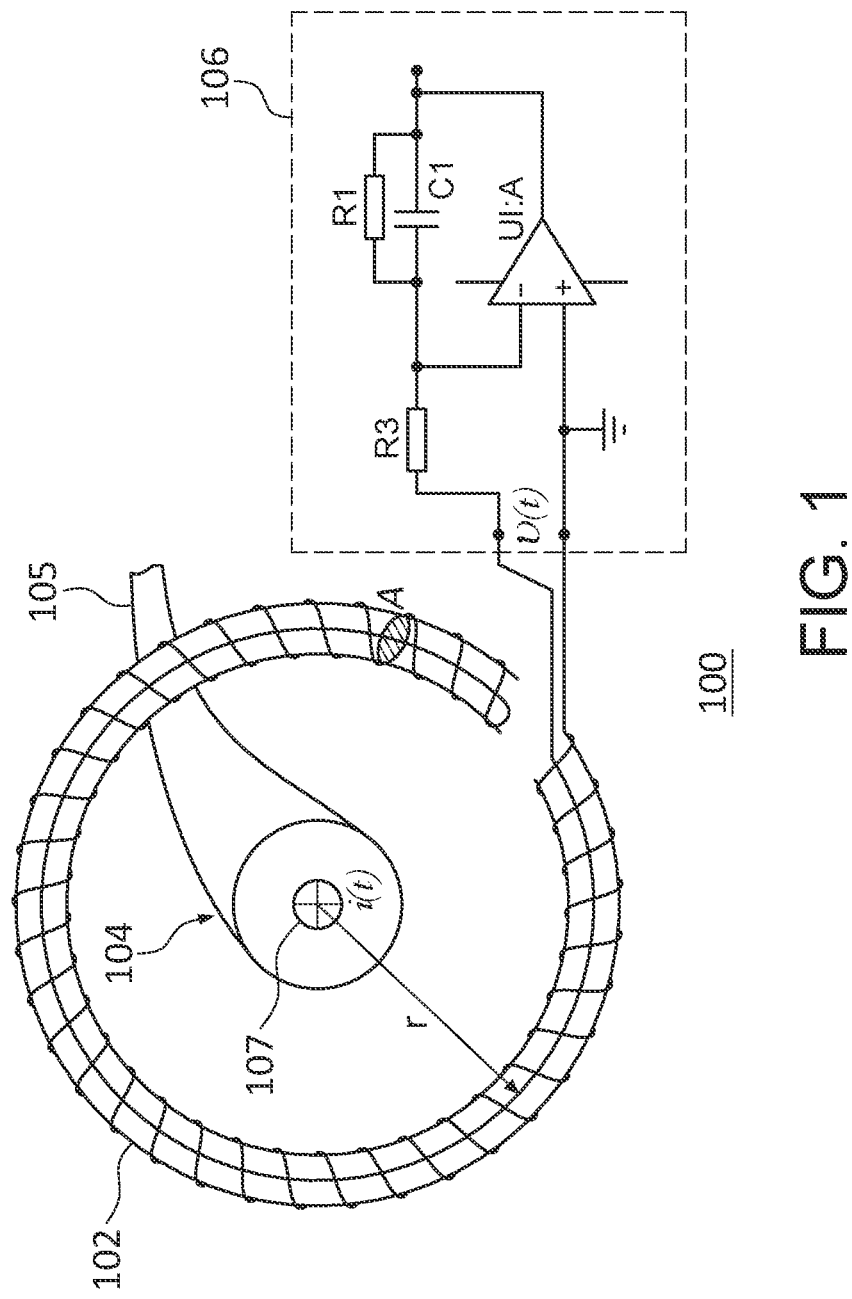
FIG. 1 illustrates a current sensor system including a current sensor and an integrator circuit used for obtaining an output voltage relative to the rate of change of current through a conductor or wire that the current sensor surrounds in accordance with exemplary embodiments of the present disclosure.

In FIG. 1, a current sensor system 100 can include a current sensor 102 coupled to an integrator circuit 106 that essentially serves as an analog to digital converter for obtaining an output voltage (Vout). The current sensor 102 is a device for measuring alternating current (AC) or high-speed current pulses. It is a coil of wire which is shown surrounding a conductor 104 such as a power transmission line. In the case of a high voltage primary input line or a high voltage primary output line, the conductor 104 would include a main conductor 107 and a surrounding neutral line 105 or lines 105. For measuring the current flow through any conductor such as conductor 107, the current sensor 102 then covers around the conductor 107.

Operationally, when current flows through the conductor 107 or 104, then some voltage produces in the current sensor 102. This voltage is directly proportion to the rate of change of current in the conductor 104 or 107. That means, induced voltage increases when the current flow increases, and induced voltage decreases when the current flow decreases. The electronic integrator circuit 106 connects to the output of the current sensor 102 to obtain such voltage. The integrator circuit 106 is basically an analog-to-digital converter which is often used for this purpose. The output digital signal of the integrator circuit 106 is used for current measuring purposes.

Use of a Rogowski coil as the current sensor 102 has several advantages over other types of current sensors, such as a current transformer, including its ability to respond to fast-changing currents and its response time, down to several nanoseconds. Due to absence of an iron core, the output of a Rogowski coil is highly linear even when subjected to large currents, such as those used in power systems, welding, or pulsed applications. Also, there is no risk of line opening of the secondary winding. Furthermore, the installation cost is lower than the cost of a current transformer and temperature compensation is plain. Also, for large current measuring, a Rogowski coil is far smaller than a current transformer for the same current rating. A disadvantage of using a Rogowski coil is that it may require a 3 to 24V DC source to operate its accompanying integrator circuit. So, without a DC source, the Rogowski coil does not operate.

Figure 2:
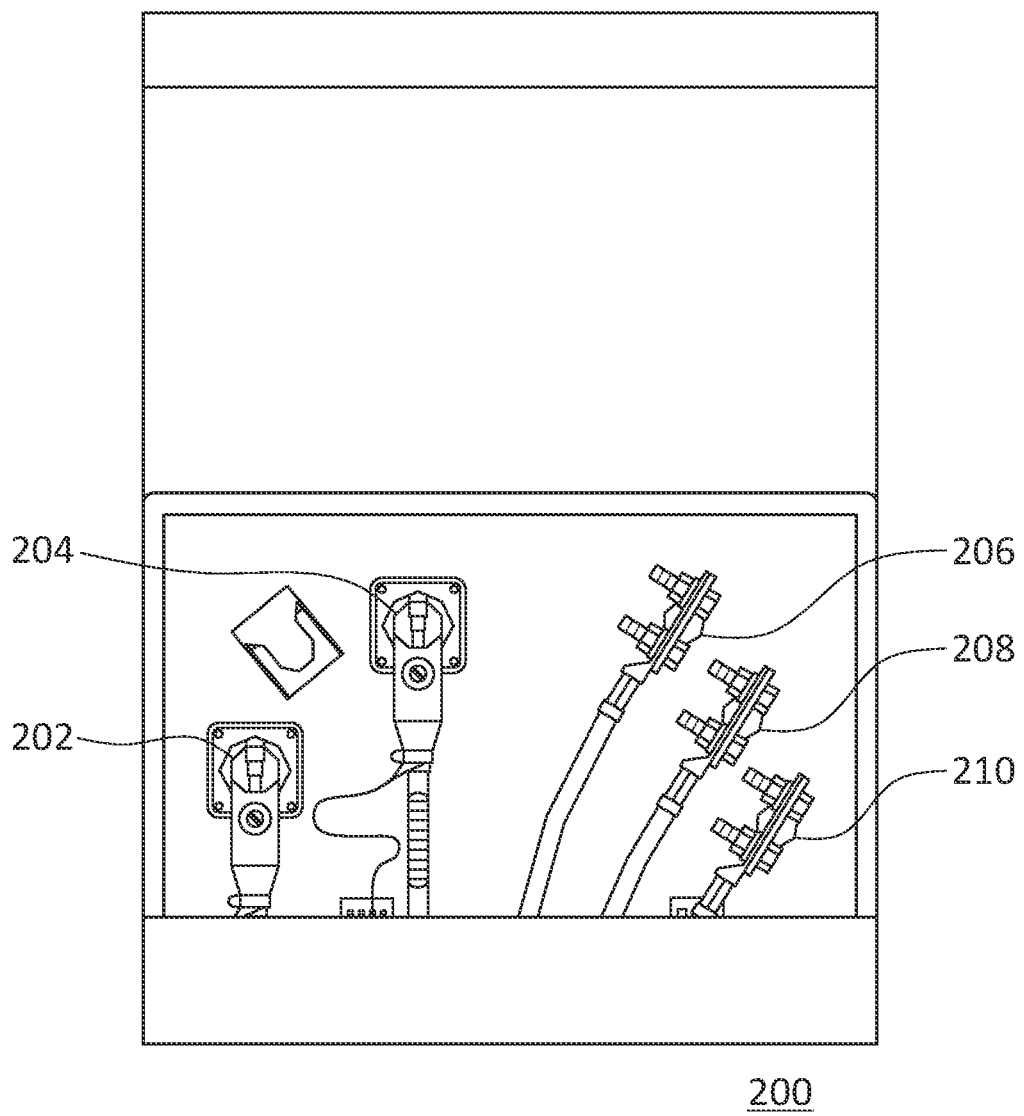
FIG. 2 illustrates a pad-mounted distribution transformer in accordance with exemplary embodiments of the present disclosure.

Referring to FIG. 2, a pad mounted distribution transformer 200 can include a high voltage primary input 202, a high voltage primary output 204, and the lower voltage secondary outputs 206, 208 and 210. Such a transformer 200 can include one or more sensors which can come in the form of a distribution transformer monitor (DTM) which is a specialized hardware device that collects and measures information relative to electricity passing into and through a distribution transformer. The embodiments herein and such DTM systems can leverage each other or in some instances be incorporated into each other. The DTM is typically a retrofit onto a pole top or pad mount transformer. A pole top (aerially mounted) or padmount transformer commonly powers anywhere from 5-10 homes and is the last voltage transition in stepping down voltage before it gets to the home or business. Standard positioning of DTM devices occurs at the transformer bushings, but sometimes they are attached directly onto the secondary electricity lines. DTM devices commonly consist of highly accurate non-piercing or piercing sensors, onboard communications modules to transmit information, and a power supply provision. The DTM device reports to a collection engine, and/or existing SCADA/MDM system where relevant transformer data is stored and presented to the user. Furthermore, analytics platforms are oftentimes employed to interpret the information being captured and reported by the DTM. Using the current sensors on the primary high voltage lines can now provide additional information for analysis and fault detection in addition to the existing DTM data telemetry collection. In other words, the embodiments herein expand the scope of analysis to include current sensor of the high voltage primary lines and also provide the ability to view and analyze waveform via an oscillography module (see FIGS. 3, 4, 9 and 10) for monitoring and/or recording primary voltage (Ip), secondary current (Is), and secondary voltage (Vs).

Due to the interior location of the DTM in a distribution grid, the DTM may present real-time and/or historical information about the transformer upon which it is hosted, in addition to creating a vital ongoing information access point within the grid architecture.

As with the contemplated use of the current sensors in the embodiments herein, DTM deployments can be strategically and sparingly positioned within a grid, or comprehensively positioned to reveal critical data for extended grid areas such as line segments, specific circuit feeders, and/or entire substations.

The embodiments herein can have their own communication links but could also leverage the existing remote over-the-air (OTA) capabilities supported by certain DTM devices. This OTA capability, when supported, allows the operator to perform remote analysis as well as configuration updates of the DTM device(s) (or the Current sensor related monitoring equipment) without the need for costly truck rolls or unit replacement. By supporting OTA firmware updates/upgrades, providers can progressively broaden and deepen the suite of data points captured by the DTM device and or other devices operating independent of the DTM device.

Figure 3:
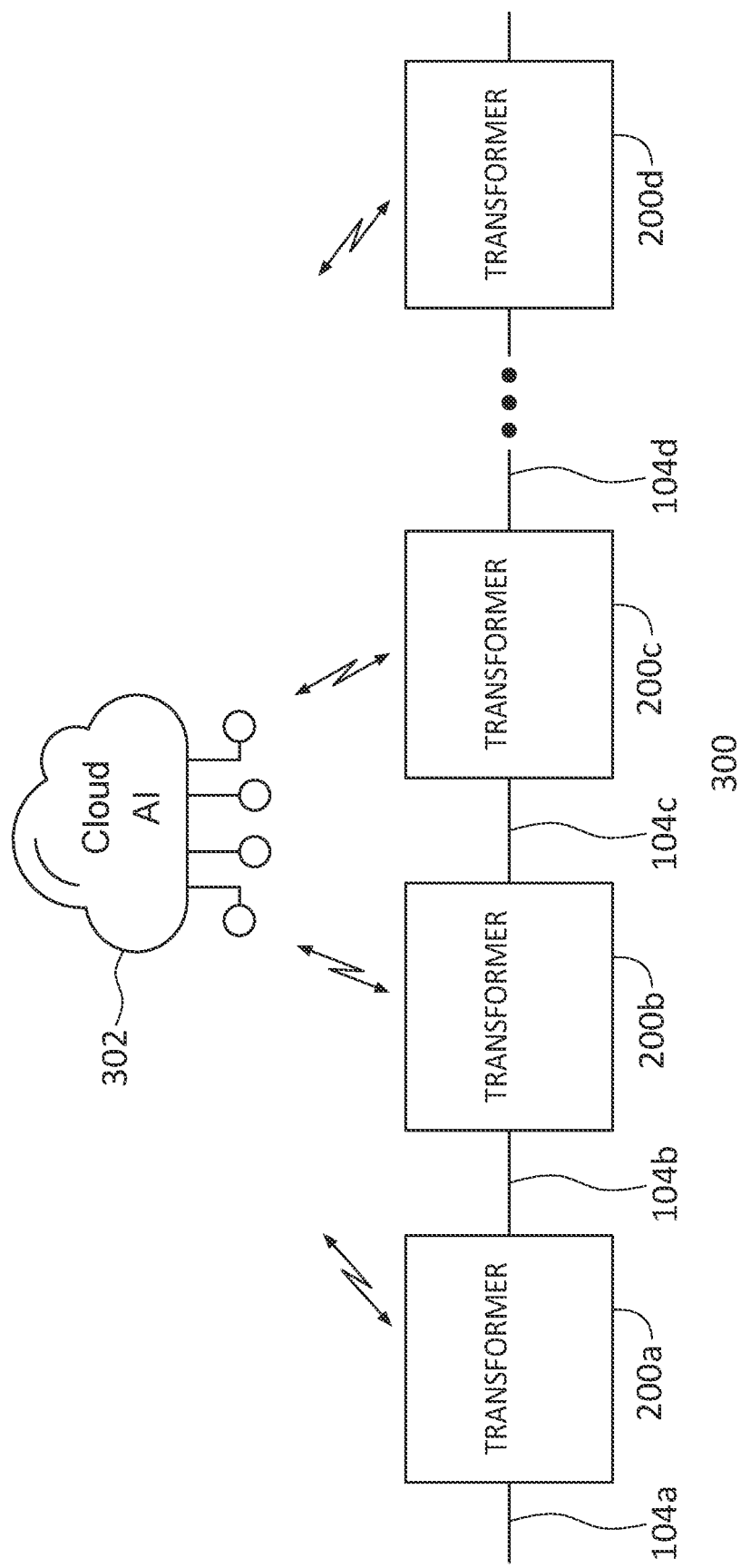
FIG. 3 illustrates a power transmission system including multiple pad-mounted distribution transformers coupled in a loop configuration and further including an artificial intelligence fault detection analysis engine, in accordance with exemplary embodiments of the present disclosure.
Figure 4:
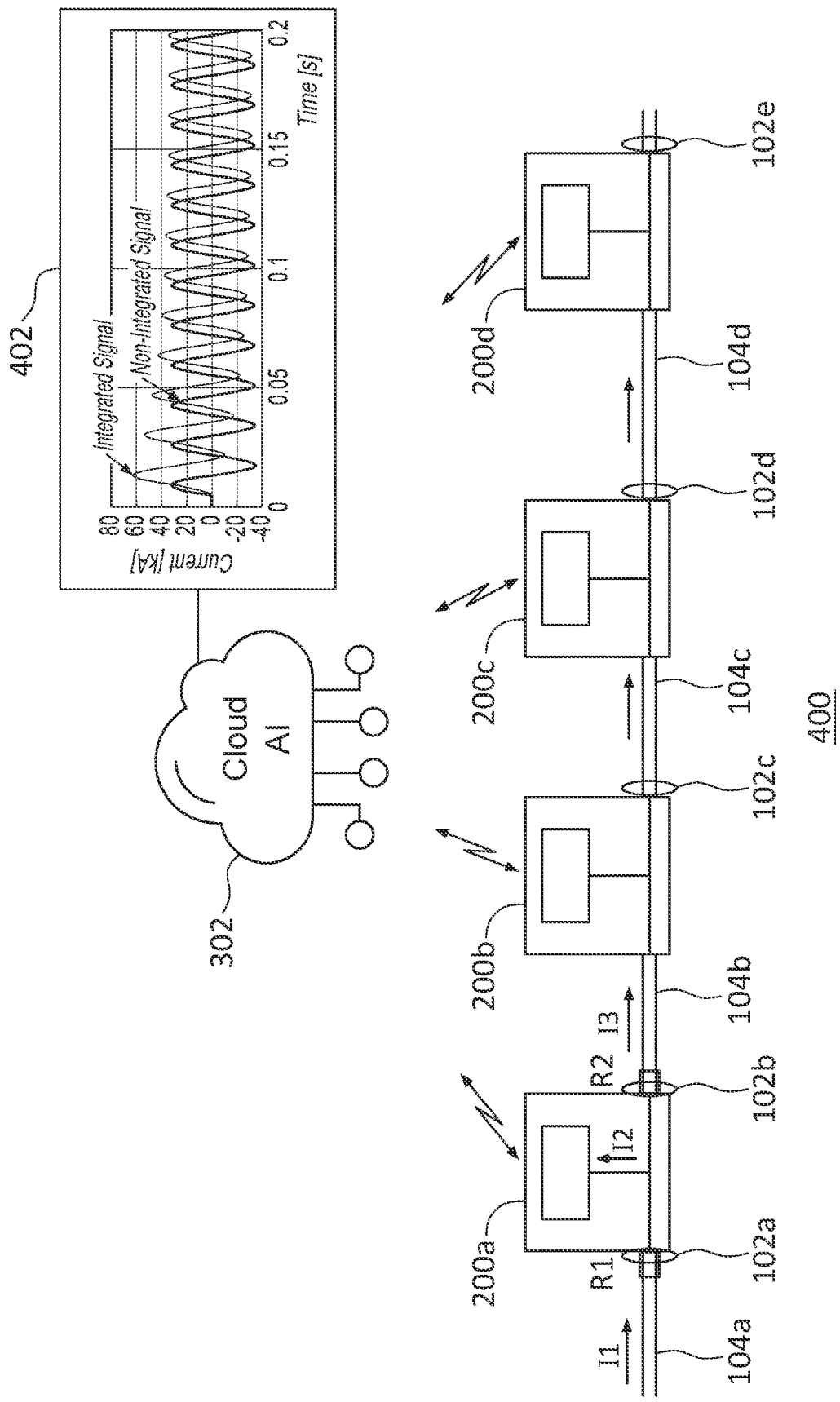
FIG. 4 illustrates block diagram of a power transmission system similar to the system of FIG. 3 and further including a waveform monitoring system and current sensors at the high voltage primary input and high voltage primary output from at least some of the pad-mounted distribution transformers, in accordance with exemplary embodiments of the present disclosure.

Referring to power transmission systems 300 of FIG. 3 and 400 of FIG. 4, the embodiments herein using the current sensors on the primary conductors also enable an artificial intelligence (AI) based fault location and mode analysis system using a cloud server 302 having such intelligence programmed within. The system 300 can include a plurality of pad mounted transformers such as underground pad mounted transformers 200a, 200b, 200c, and 200d having a high voltage primary input conductor and/or high voltage primary output conductors 104a-104d. The conductors 104a-104d are the high voltage primary input conductors to corresponding distribution transformers 200a-200d. The conductors 104b, 104c, 104d are the high voltage primary output conductors coming out from corresponding transformers 200a-200c. In some embodiments, an AI fault detection analysis engine using the AI cloud server 302 can perform such analysis either using event triggers or polling techniques, which can monitor primary and secondary voltage and current waveforms, as well as other waveforms which can be viewed on a display or an oscilloscope 402. The additional data provided by the current sensors in such manner can also further help classify or categorize the types of faults that are detected and also provide a better fault location vector in order to pinpoint the locations of such fault on a more granular level. In some embodiments and with further reference to FIG. 4, the current drop experienced through each primary coil in each pad mounted transformer 200a-200d can be measured or calculated and compared to a predetermined expected standard. The current (I2) flowing through the primary (high voltage) winding of transformer 200a would be the difference between the determined primary input current (I1) and the determined primary output current (I3) coming from the primary winding. Similar determinations can be made for some or each transformer 200a-200d in the system 400. All the data collected would be transmitted either in a wired fashion or via a wireless connection.

Figure 5:
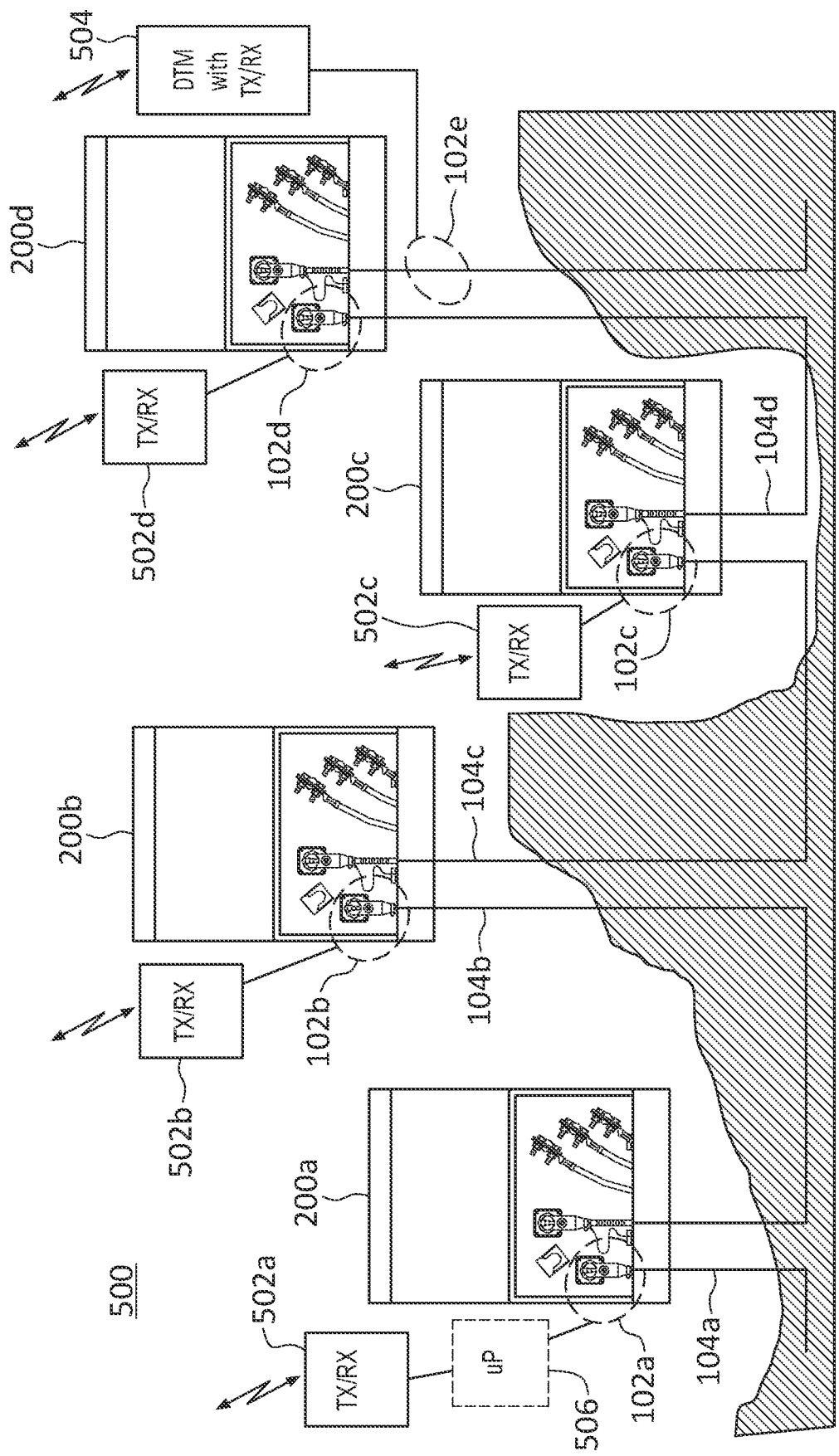
FIG. 5 illustrates a power transmission system similar to the system of FIG. 4 and further including multiple transceivers in accordance with exemplary embodiments of the present disclosure.

In some embodiments as illustrated by the system 500 of FIG. 5, a system similar to the system 400 can further include one or more transceivers 502a, 502b, 502c, and 502 coupled to the corresponding current sensors 102a-102e or the current sensor systems 100 (see FIG. 1). The current sensors or systems 100 can be coupled to one or more processors 506 (only one is shown for simplicity). The transceivers or at least transmitters 502a-502d can wirelessly transmit the data obtained via the corresponding current sensor systems 100 (and processors 506) to the AI cloud servers 302. Alternatively or additionally, if the system 500 further includes a DTM monitoring system 504 with transmitting capability, the current sensors 102a-102e or systems 100 can be coupled to the DTM to leverage the transmission capabilities already existing in the DTM system 504. Only one DTM system 504 is shown for simplicity, but in some embodiments, some pad-mounted transformers 200a-200d can include such DTM systems 504 and in other embodiments, each pad-mounted transformer includes a DTM system 504. Further note that if a transceiver is included in such systems rather than just a transmitter, the OTA updates or upgrades can be facilitated as noted above.

Figure 6:
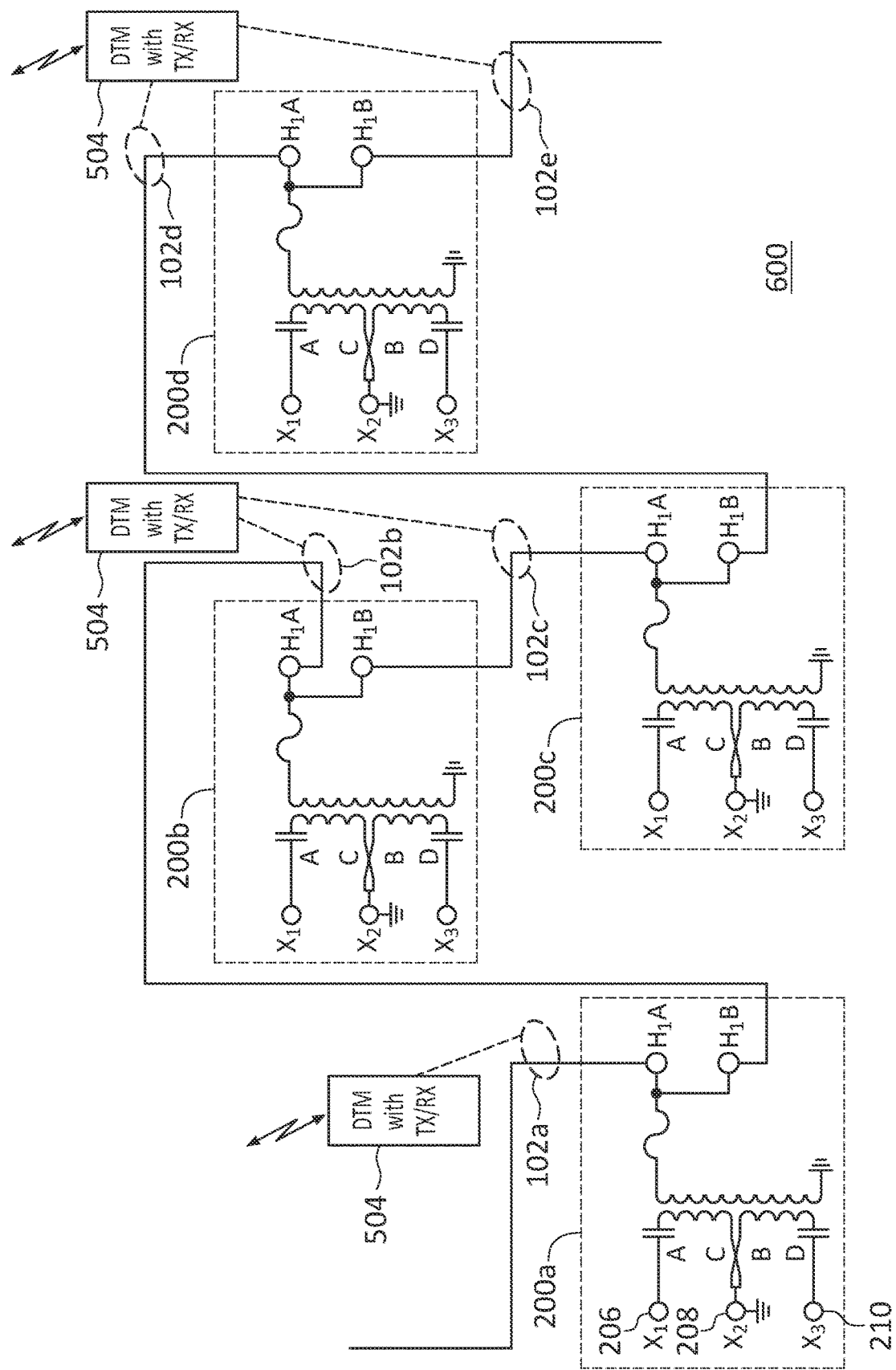
FIG. 6 illustrates a circuit diagram representing a portion of the power transmission system of either FIG. 4 or FIG. 5 in accordance with exemplary embodiments of the present disclosure.

In some embodiments such as the system 600 of FIG. 6, a similar system to system 500 of FIG. 5 can leverage the transceiving or transmitting capabilities of one or more DTM systems 504 forming a part of the overall system 600. Also note that the data collected or calculated by some or each current sensor 102a-102e or coil system 100 can be relayed to the AI cloud server 302 via the transmitter in the corresponding DTM system 504 as shown in FIG. 6. Note that there may be instances where data or information from several current sensor systems 100 can be collected and transmitted via a single DTM system (102b-102c and 102d-102e). Further note that the collection of data from the current sensor systems 100 to the DTM systems 504 or the transceivers 502 (in FIG. 5) can be done via wired or wireless connection. Any number of protocols can be used for such short distance communication, such as Bluetooth, Bluetooth LE, Wi-Fi, etc. Also, the transmission protocols from the DTM system 504 or the transceivers 502 can use longer range transmission such as any number of cellular or satellite communication protocols (e.g., LTE, 5G, 4G, etc.). Communication over the power transmission lines themselves may also be possible in certain instances.

Figure 7:
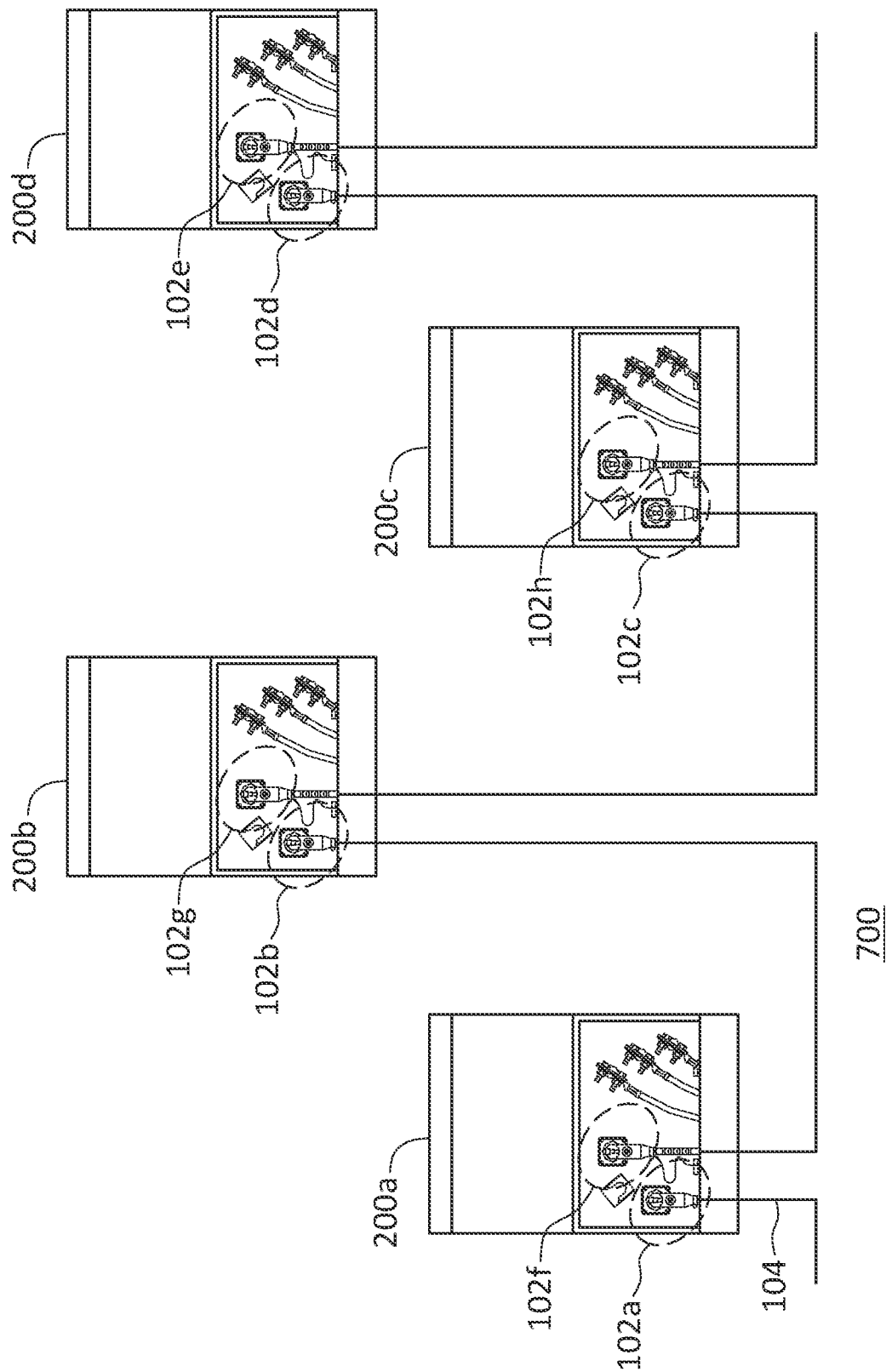
FIG. 7 illustrates an alternative power transmission system similar to the systems of FIGS. 4-6 and further including current sensors at the high voltage primary input and high voltage primary output from each pad-mounted distribution transformer in accordance with exemplary embodiments of the present disclosure.

In some embodiments of the system 700 of FIG. 7, a current sensor can be included at each input 102a-102d and output 102e-102h of the high voltage primary line for each transformer 200a-200d as shown.

Figure 8:
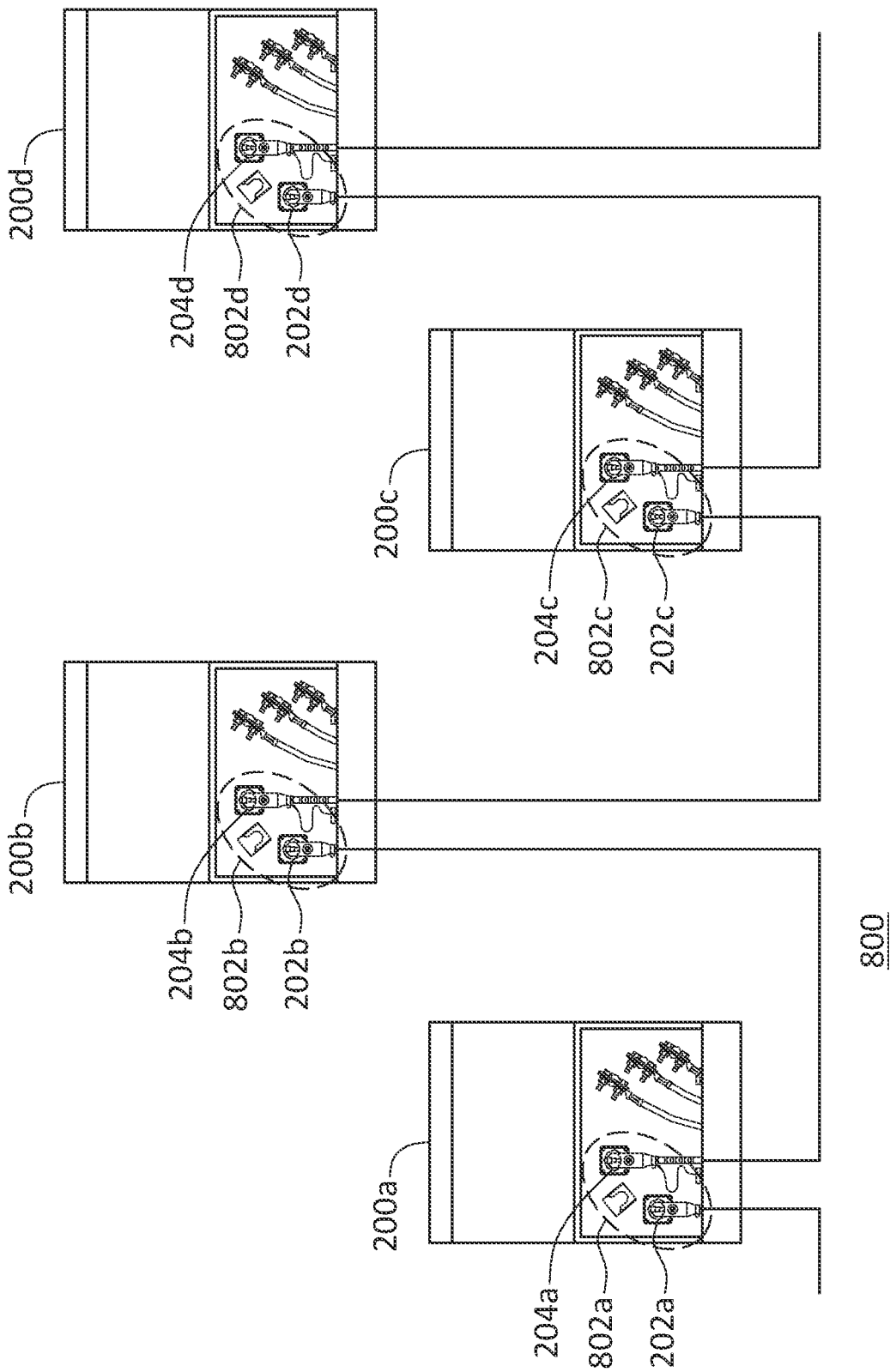
FIG. 8 illustrates a power transmission system similar to the systems of FIGS. 3-7 but using a single current sensor surrounding both the high voltage primary input and high voltage primary output from each pad-mounted distribution transformer in accordance with exemplary embodiments of the present disclosure.
Figure 9:
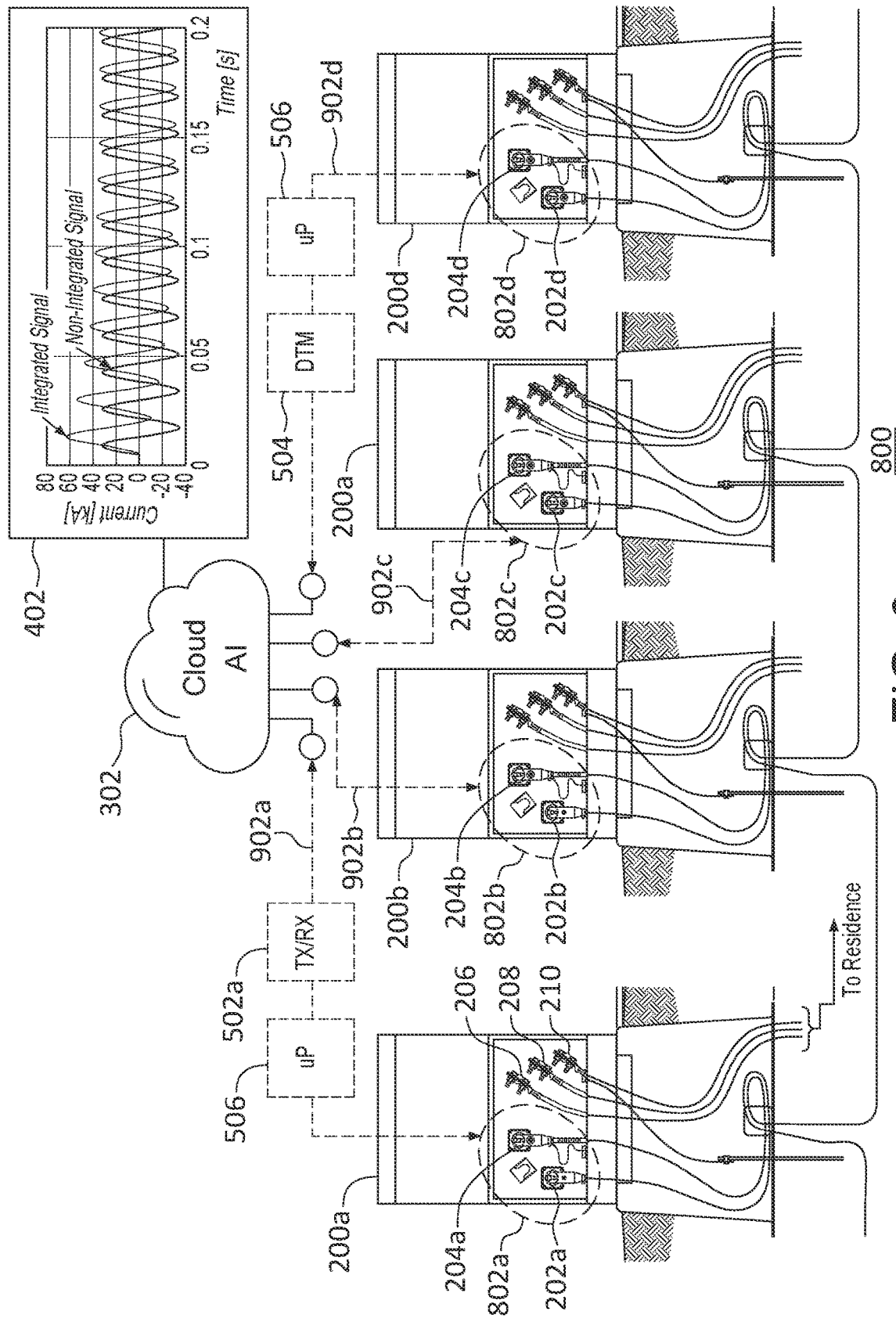
FIG. 9 illustrates a more detailed view of the power transmission system of FIG. 8 and further including an artificial intelligence analysis system and waveform monitoring system in accordance with exemplary embodiments of the present disclosure.

In some embodiments as shown in the power transmission system 800 of FIG. 8 or the power transmission system 900 of FIG. 9, a system for detecting faults in underground power transmission systems can also use a single current sensor positioned around the primary high voltage input and the primary high voltage output of a pad mounted transformer to derive the primary winding current (e.g., I2 in FIG. 4) directly for the distribution transformer 200a-200d. In other words, such a system may include a single current sensor 802a placed concurrently around a conductor (e.g., a terminal) for the primary input 202a of a distribution transformer 200a and a conductor for the primary output 204a of the distribution transformer 200a for at least some of the distribution transformers 200a-200d configured in a loop configuration, one or more processors 506 coupled to the corresponding single current sensor 802a-802d at the one or more transformers 200a-200d, and a memory coupled to the one or more processors 506, the memory containing computer instructions when executed by the one or more processors perform certain functions. Note, the embodiments are not limited to the particular embodiments shown and can include any number of processors and memory either locally at the transformer or at a remote server. In some embodiments, the memory can be embedded with the processor devices. The processors can be programmed to monitor at least a first parameter for at least a first transformer among the plurality of transformers using the single current sensor (or coils at respective transformers) and can further generate an alert when at least the first parameter is outside a predetermined deviation from a reference parameter value. In some embodiments, the first parameter is a current drop measured on a primary coil of the at least one or more transformers and in other embodiments the first parameter is one of primary current, secondary current, or secondary voltage. In some embodiments, each of the single current sensors are coupled to at least one high speed analog to digital converter (as shown in FIG. 1) and the analog to digital converter is coupled to the one or more processors 506 and where the one or more processors 506, or cloud server 302, or an oscilloscope or oscilloscope application running on the cloud server 302 provides instantaneous voltage and current waveforms as reflected on the oscilloscope or a display 402.

As shown in prior embodiments, some embodiments as shown in FIG. 9 can include one or more wireless transmitters (502*a*, for example) coupled to the one or more processors 506 for transmitting (via a communication channel 902*a* and/or transceiver 1002*a*, for example) at least a first parameter or an alert to a remote server 302 (e.g., a cloud server). The transmitters 502*a* can be stand-alone devices or be part of transceivers that couple to the current sensor systems 100 or to an existing DTM system or a new DTM system 504 (see also FIGS. 5, 6 and 10) that can integrate the additional functionalities of the current sensor systems 100. For a new DTM system 504 communication of alerts or detected parameters may occur via an alternative communication channel 902*d* and/or transceiver 1002*d*, for example.

Figure 10:
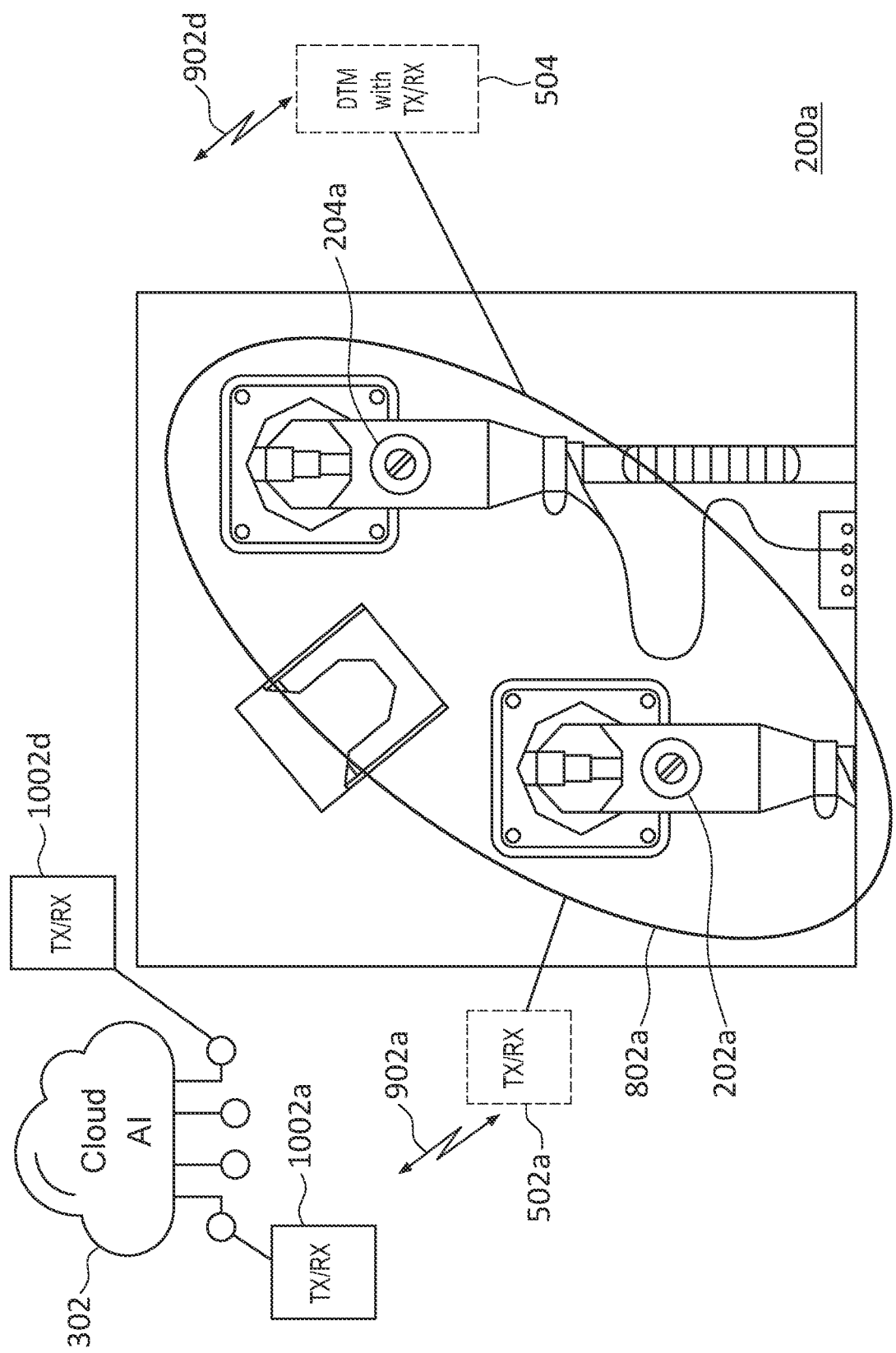
FIG. 10 illustrates an enlarged view of a portion of a single pad-mounted distribution transformer having a single current sensor surrounding both the high voltage primary input and the high voltage primary output in accordance with exemplary embodiments of the present disclosure.

In some embodiments as shown in the system 800 of FIGS. 8 and 9, the single current sensor is placed around the primary input terminal of the high voltage side and the primary output terminal of the high voltage side for each of the plurality of transformers in the loop configuration. FIG. 10 illustrates use of a single current sensor 802*a* (or system 100) concurrently surrounding both the high voltage primary input 202*a* and high voltage primary output 204*a*, where the data obtained from the current sensor is transmitted to the remote server. As previously noted, some systems can include a single current sensor for every transformer in a system, some systems may include a single current sensor interspersed among the transformers in a system and some may specifically include a single current transformer per every predetermined number of transformers in a system or in a particular instance for every other transformer in a system.

Figure 11:
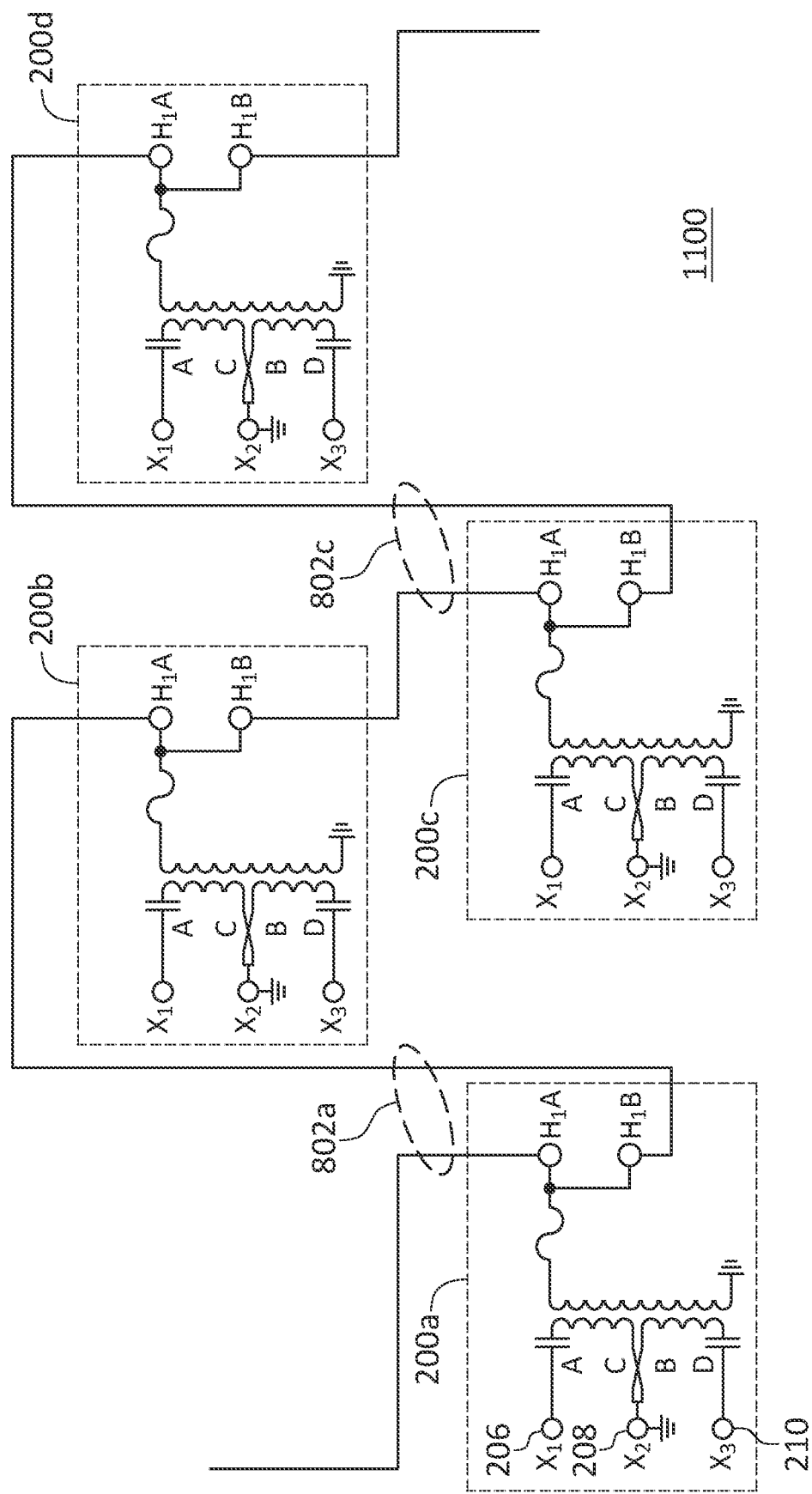
FIG. 11 is a circuit diagram illustrating an alternative power transmission system similar to the systems of FIGS. 8-10 in accordance with exemplary embodiments of the present disclosure.

In some embodiments, as shown in the system 1100 of FIG. 11, the single current sensors 802*a*, 802*c* are each placed concurrently around the primary input of the high voltage side and the primary output of the high voltage side for each of a certain number of the transformers among the plurality of transformers in the loop configuration. In one particular embodiment, the single current sensor is placed around the primary input of the high voltage side and the primary output of the high voltage side for at least every other of the transformers among the plurality of transformers in the loop configuration. Such a system can reduce overall cost by not deploying current sensors and related infrastructure on each transformer within a transmission line system.

Figure 12:
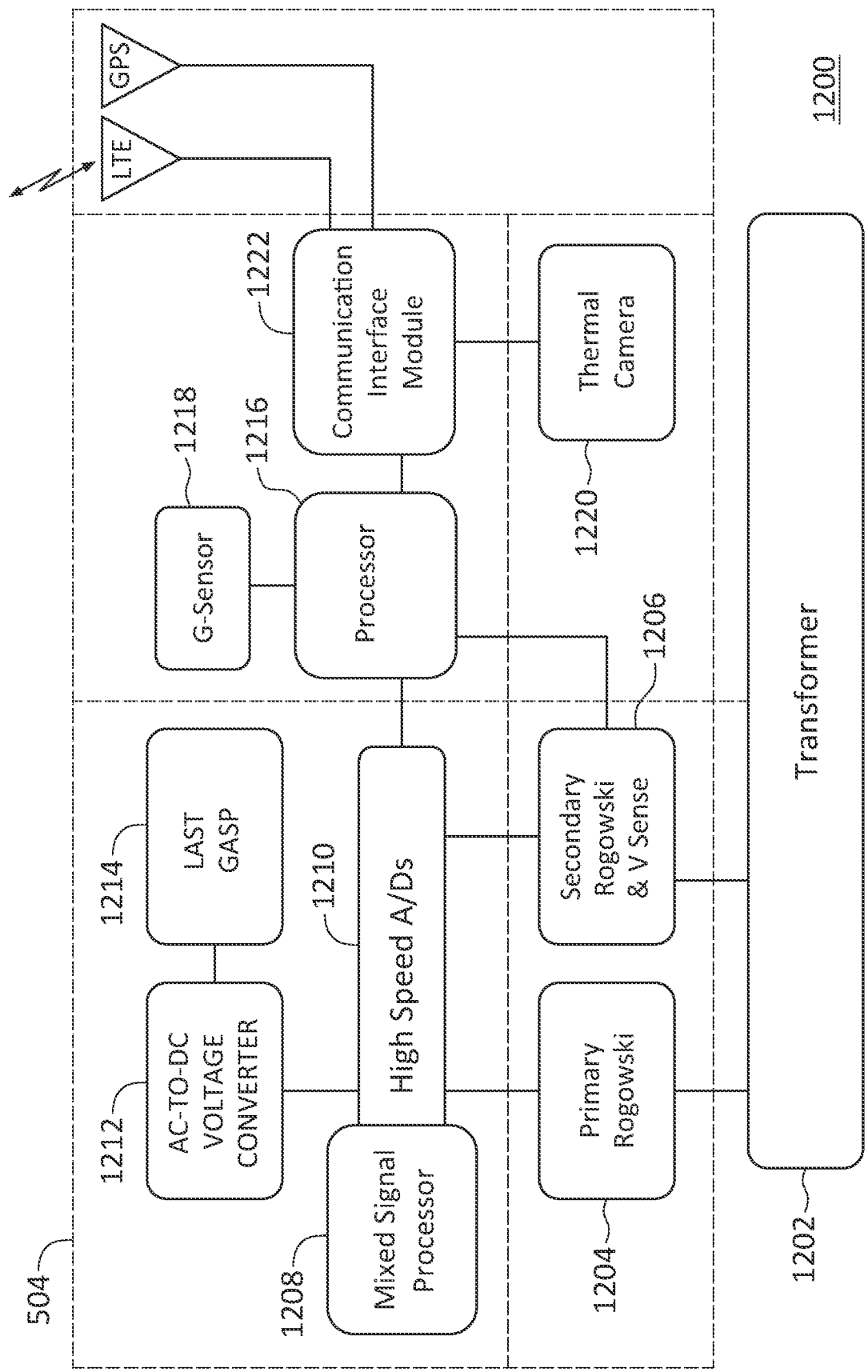
FIG. 12 is a block diagram of a distribution transformer monitor coupled to a transformer in accordance with exemplary embodiments of the present disclosure.

Operationally each of the single current sensors can generate respective voltages which are proportional to a rate of change of a current flowing through the respective conductors that the current sensor resides around. In some embodiments the current sensors and their integrator circuits as shown in FIG. 1 can be stand-alone devices or systems 100 and in other embodiments, they can be incorporate wholly or partially as part of a distribution transformer monitoring or DTM system 504 or part of an overall system 1200 as shown in FIG. 12. The dash lines in FIG. 12 are shown to reflect that a number of components can belong to one system or another (DTM, current sensor system, communication system, etc.), but the functionality is not limited to reside in one particular device or another.

The overall transmission system 1200 of FIG. 12 in one embodiment can include a number of separate components or components that form a part of a number of integrated devices that includes all or some of the functionality of the separate individual components shown that would monitor a transformer 1202 such as a pad-mounted transformer. For example, a DTM system 504 can include all or some of the components including a current sensor system 100 which can include, inter alia, a primary current sensor or coils 1204, a secondary current sensor or coils 1206 (which can further include voltage sensing), a mixed signal processor 1208, and a high-speed Analog to Digital converter 1210. The DTM system 504 in some embodiments can further include a microcontroller or other processor 1216 and a communication interface module 1222.

In one embodiment, the mixed signal processor 1208 may be used to provide instantaneous voltage and current waveforms and calculate RMS values of voltage and currents, as well as active, reactive, and apparent power and energies. The processor 1208 can be a mixed signal integrated circuit (IC) family consisting of an analog and a digital section. In another embodiment, the system can use a separate device for an ADC in the form of ADC 120.

The devices, such as the ADC 1210 and the secondary current sensor with voltage sense 1206, can be coupled to a processor 1216. The processor 1216 can send (or receive) the gathered data (from the microcontroller 1216, GPS, etc.) to a communication module 1222, which supports communication via LTE, 5G, or other wireless communication protocols and is also able to receive and transmit GPS or other location data to a remote server. Of course, other communication protocols such as 5G and ultra-wideband are contemplated within the embodiments. In some embodiments, the communication module 1222 can include a global positioning system receiver and in other embodiments a separate GPS receiver can be coupled to at least one or more transformers among the plurality of transformers to detect any sudden movement or acceleration (earthquake, crash impact, lightning strike, etc.). In some embodiments, the system can further monitor and transmit at least a corresponding waveform or data representative of the waveform for at least one or more of the transformers in such a system using the current sensor or coils (and an oscilloscope or display) as previously described. The system would generally be configured to generate an alert when at least the corresponding waveform (or certain data) is beyond a predetermined deviation from a reference waveform (or from reference data).

In some embodiments, the system can monitor at least a first parameter for at least a first transformer and a second transformer among the plurality of transformers using a first single current sensor and a second single current sensor and generating an alert when at least the first parameter is outside the predetermined deviation from a reference parameter value for the first single current sensor or the second single current sensor or both. The same can be done with other configurations using current sensors. In some embodiments such a system can further include one or more wireless transmitters coupled to the one or more processors for transmitting the at least first parameter to a remote server and where the remote server further uses artificial intelligence in the form of machine learning to generate the alert when at least the first parameter or waveform is outside the predetermined deviation from a reference parameter value or a reference waveform.

In further embodiments, a processor 302, 1216 may perform a method for detecting and isolating a fault in an underground power transmission system having a plurality of distribution transformers 200*a*-200*d*. The processor may be a processor 1216 forming part of a distribution transformer monitor 504 installed at or near one of the distribution transformers 200a-200d configured in the loop. Alternatively, the processor may be part of a remote computing device 302, such as a cloud server, in communication with distribution transformer monitors 504 or other sensors 502a-502d installed at or near the distribution transformers 200a-200d in the loop.

In accordance with the exemplary method, the processor 302, 1216 receives a first signal representing an output of a first current sensor (e.g., current sensor 102b in FIG. 4) positioned to sense a primary current entering a first distribution transformer (e.g., distribution transformer 200b). The first current sensor 102b may be positioned at or near the primary input of the first distribution transformer 200b (e.g., at the primary input bushing/terminal) or may be positioned at or near the primary output of another distribution transformer 200a (e.g., at the primary output bushing/terminal), which has its primary output electrically in series with the primary input of the first distribution transformer 200b. Further, the first current sensor 102b may be positioned at a location along the primary power conductor 104b before the primary conductor 104b enters the first distribution transformer 200b.

The processor 302, 1216 also receives a second signal representing an output of a second current sensor (e.g., current sensor 102c) positioned to sense a primary current exiting the first distribution transformer 200b. Analogous to the locations of the first current sensor 102b, the second current sensor 102c may be positioned at or near the primary output of the first distribution transformer 200b (e.g., at the primary output terminal) or may be positioned at or near the primary input of another distribution transformer 200c (e.g., at the primary input terminal), which has its primary input electrically in series with the primary output of the first distribution transformer 200b. Further, the second current sensor 102c may be positioned at a location along the primary power conductor 104c after the primary conductor exits the first distribution transformer 200b but before the primary conductor 1104c enters another distribution transformer 200c in the loop.

After receiving the two signals, the processor 302, 1216 determines a first current based on the first signal (e.g., the primary conductor current, if any, entering the first distribution transformer 200b) and determines a second current based on the second signal (e.g., the primary conductor current, if any, exiting the first distribution transformer 200b). The processor 302, 1216 then generates an alert when one or both determined currents are outside their respective current ranges (e.g., the determined current is more than a threshold percentage outside its expected range).

The current sensors 102b, 102c may be standalone sensors with their own communication capabilities (e.g., wireless transceivers, such as transceivers 502b, 502c in FIG. 5) or they may be part of one or more distribution transformer monitors 504. For example, where the first current sensor 102b is mounted to a primary input terminal of the first distribution transformer 200b and the second current sensor 102c is mounted to a primary output terminal of the first distribution transformer 200b, the current sensors 102b, 102c may form part of a distribution transformer monitor 504 located at or near the first distribution transformer 200b. Alternatively, where the first current sensor 102b is mounted to a primary input terminal of the first distribution transformer 200b and the second current sensor 102c is mounted to a primary input terminal of a second distribution transformer 200c that is electrically in series with the primary output of the first distribution transformer 200b, the first current sensor 102b may form part of a first distribution transformer monitor 504 located at or near the first distribution transformer 200b and the second current sensor 102c may form part of a second distribution transformer monitor 504 located at or near the second distribution transformer 200c.

The alert communicated by the processor 302, 1216 may inform a target of the alert when the primary winding current value of a distribution transformer 200b, 200c was outside its respective range and, therefore, which distribution transformer 200b, 200c caused a loop current fault. The alert may also include additional information, such as the determined current values, GPS location of the faulty distribution transformer, and other parameter data for the faulty distribution transformer as detected by other sensors at the distribution transformer.

In alternative embodiments, a system for detecting a current fault in a power transmission system 800 including distribution transformers 200a-200d in a loop configuration may include a current sensor 802a-802d and one or more processors 302, 506, 1216. In these embodiments, the current sensor (e.g., current sensor 802a) may be positioned to concurrently sense a primary input current to and a primary output current from a distribution transformer (e.g., distribution transformer 200a). Thus, the current sensor 802a may generate a voltage that is proportional to the rate of change of the current flowing in the primary winding of the distribution transformer 200a. In other words, the current sensor 802a may effectively and directly sense the differential current flowing in the primary winding of the distribution transformer 200a. The current flowing in the primary winding of the distribution transformer 200a is a difference between the primary input current and the primary output current. The one or more processors 302, 506, 1216 are operable to receive a signal representing an output of the current sensor 802a, determine a value representing a current flowing in the primary winding of the distribution transformer 200a based on the received signal, and generate an alert when the determined value is outside a desired range of values. In one embodiment, the current sensor 802a is a single Rogowski coil, which may be positioned concurrently around a primary input terminal 202a and a primary output terminal 204a of the distribution transformer 200a.

The fault detection system may further include an analog-to-digital converter 1210 operably positioned between the current sensor 200a and the one or more processors 506, 1216. In this embodiment, the analog-to-digital converter 1210 converts an analog output of the current sensor 802a, 1204 into the signal received by the one or more processors, wherein the signal is in digital form. Additionally or alternatively, the fault detection system may also include a wireless transmitter 502a, 504, 1222 operably coupled to the one or more processors 506, 1216 for transmitting data representing at least one of the signal and the alert to a remote server 302 (e.g., a cloud server) or other remote computing device. In a further embodiment, one or more of the processors 506, 1216 may form part of the remote server 302 to which the signal was communicated, wherein the processor(s) at the server 302 is operable to receive the signal, determine the value associated with the primary winding current, and generate the alert when the value is outside the desired range of values. In one or more additional or alternative embodiments, the current sensor 802a and a processor 1216 of the one or more processors may form part of a distribution transformer monitor 504, which may be positioned at the distribution transformer 200a. In these embodiments, the processor 1216 may be operable to receive the signal, determine the value associated with the primary winding current, and generate the alert when the value is outside the desired range of values.

In one or more additional or alternative embodiments, the fault detection system may further include a second current sensor (e.g., current sensor 802b but could alternatively be sensor 802c or sensor 802d) positioned to concurrently sense a primary input current to and a primary output current from a second distribution transformer 200b in the power transmission system 800. In such an embodiment, the fault detection system processor(s) 302, 506, 1216 may receive a second signal representing an output of the second current sensor 802b, determine a second value representing a current flowing in a primary winding of the second distribution transformer 200b based on the received second signal, and generate a second alert when the second value is outside a second desired range of values. In one or more additional or alternative embodiments involving use of the second current sensor 802b, the second current sensor 802b and a processor 1216 of the one or more processors may form part of a distribution transformer monitor 504 positioned at the second distribution transformer 200b, in which case the processor 1216 may be operable to receive the second signal, determine the second value associated with the primary winding current of the second distribution transformer 200b, and generate the alert when the second value is outside the second desired range of values.

In one or more additional or alternative embodiments, an apparatus for detecting a current fault in a power transmission system 800 including distribution transformers 200a-200d in a loop configuration may include a current sensor (e.g., current sensor 802a) positioned to concurrently sense a primary input current to and a primary output current from a distribution transformer (e.g., distribution transformer 200a) and a processor 302, 506, 1216 operable to receive a signal representing an output of the current sensor 802a, determine a value representing a current flowing in a primary winding of the distribution transformer 200a based on the received signal, and generate an alert when the value is outside a desired range of values. In one exemplary embodiment, the current sensor 802a may be positioned concurrently around a primary input terminal 202a and a primary output terminal 204a of the distribution transformer 200a. The fault detection apparatus may form all or part of a distribution transformer monitor 504, and the current sensor 802a may be a single Rogowski coil or may otherwise generate a voltage that is proportional to a rate of change of the current flowing in the primary winding of the distribution transformer 200a, wherein the current flowing in the primary winding of the distribution transformer 200a is a difference between the primary input current and the primary output current.

In one or more additional or alternative embodiments, the fault detection apparatus may also include an analog-to-digital converter 1210 operably positioned between the current sensor 802a, 1204 and the processor 1216, where the analog-to-digital converter 1210 converts an analog output of the current sensor 1204 to the signal associated with the primary winding current as received by the processor 1216, wherein the signal is in digital form. The fault detection apparatus may further include a wireless transmitter 502a, 504, 1222 coupled to the processor 1216 for transmitting at least the alert to a remote server 302, such as a cloud server or other remote computing device or system.

In additional or alternative embodiments, a processor 302, 506, 1216 may perform a method for detecting a fault in a power transmission system 800 having multiple distribution transformers 200a-200d in a loop configuration. The processor may be a processor 1216 forming part of a distribution transformer monitor 504 installed at or near one of the distribution transformers (e.g., distribution transformer 200a) configured in the loop. Alternatively or additionally, the processor may be part of a remote computing device 302, such as a cloud server, in communication with distribution transformer monitors 504 or other sensors installed at or near the distribution transformers 200a-200d in the loop.

In accordance with the exemplary method, the processor 302, 506, 1216 receives a signal representing an output of a current sensor 802a positioned to concurrently sense a primary current entering a distribution transformer 200a of the power transmission system 800 and a primary current exiting the distribution transformer 200a. The processor 302, 506, 1216 determines a value representing a current flowing in a primary winding of the distribution transformer 200a based on the received signal and generates an alert when the determined value is outside a desired range of values. Additionally or alternatively, at least the current sensor 802a may form part of a distribution transformer monitor 504 positioned at the distribution transformer 200a. Further, the current sensor 802a may be positioned concurrently around a primary input terminal 202a and a primary output terminal 204a of the distribution transformer 200a.

In additional or alternative embodiments, the processor (e.g., when forming part of a remote server 302) may receive a second signal representing an output of a second current sensor (e.g., current sensor 802c) positioned to concurrently sense a primary current entering a second distribution transformer 200c of the power transmission system 800 and a primary current exiting the second distribution transformer 200c. In such a case, the processor 302 may also determine a second value representing a current flowing in a primary winding of the second distribution transformer 200c based on the received second signal and generate a second alert when the second value is outside a second desired range of values. Each distribution transformer 200a-200d of the power transmission system 800 may be equipped with at least a current sensor 802a-802d positioned to concurrently sense a primary input current and a primary output current for the distribution transformer 200a-200d, as well as other optional components, such as a wireless transmitter or transceiver 502a, 504, 902a, 1222, to provide a signal representing the differential current value to a processor 302, 1216, which may be located in a remote server or computing device or in one of the distribution transformer monitors 504 installed at distribution transformers 200a-200d in the power transmission system 800. The processor 302, 1216 is then capable of generating and sending an alert identifying a faulty transformer when the differential current value is outside a desired range of values. Other sensors at the distribution transformers, which may or may not be part of installed distribution transformer monitors 504, may also be used to provide further information, such as geolocations, from which to identify faulty distribution transformers.

In alternative embodiments and referring to FIGS. 4, 7, 8, and 12, a system for detecting a fault in a distribution transformer 200a-200d of a power transmission system 400, 700 may include a current sensor 102b-102h and one or more processors 302, 504, 506, 1216. In these embodiments, the current sensor (e.g., current sensor 102g) may be positioned to sense a primary output current flowing from the distribution transformer (e.g., distribution transformer 200b). For example, the current sensor 102g may be positioned around a primary output terminal 204b of the distribution transformer 200*b*. The processor 302, 504, 506, 1216 may be operable to receive an output of the current sensor 102*g* over time, generate a time-varying output signal representing the received output of the current sensor 102*g*, compare at least the time-varying output signal to one or more transformer fault profiles to produce a fault analysis, and generate an alert when the fault analysis indicates a transformer fault condition. Thus, in this embodiment, the fault detection system performs its fault analysis using oscillography. The fault detection system may also include an analog-to-digital converter 1210 operably positioned between the current sensor 102*g*, 1204 and the processor 1216. The analog-to-digital converter 1210 may convert an analog output of the current sensor 102*g*, 1204 to the output of the current sensor 102*g*, 1204 received by the processor 1216, wherein the output of the current sensor 102*g*, 1204 received by the processor 1216 is in digital form. The fault detection system may further include a wireless transmitter 1222 operably coupled to the processor 1216 for transmitting at least one of the time-varying output signal and the alert to a remote processing system, such as a remote server 302 (e.g., a cloud server).

In other alternative embodiments, a system for detecting a fault in a distribution transformer of a power transmission system includes first current sensor (e.g., current sensor 102*g*) positioned to sense a primary output current flowing from the distribution transformer (e.g., distribution transformer 200*b*), at least a second current sensor 102 positioned to sense at least one secondary output current flowing from the distribution transformer 200*b*, and one or more processors 302, 504, 506, 1216. The processor(s) 302, 504, 506, 1216 is operable to receive an output of the first current sensor 102*g* over time, receive an output of the second current sensor 102 over time, generate a first time-varying output signal representing the received output of the first current sensor 102*g*, generate a second time-varying output signal representing the received output of the second current sensor 102, compare at least the first time-varying output signal to a first set of transformer fault profiles to produce a first fault analysis, compare at least the second time-varying output signal to a second set of transformer fault profiles to produce a second fault analysis, generate a first alert when the first fault analysis indicates a transformer fault condition related to a primary side of the distribution transformer 200*b*, and generate a second alert when the second fault analysis indicates a transformer fault condition related to a secondary side of the distribution transformer 200*b*. Thus, in this embodiment, the fault detection system performs its fault analysis using oscillography. The fault detection system may also include one or more wireless transmitters 502*b*, 504, 1222 coupled to the processor(s) 504, 506, 1216 for transmitting at least one of the first time-varying output signal, the second time-varying output signal, the first alert, and the second alert to a remote processing system 302, such as a cloud server.

For the purpose of sensing the primary output current flowing from the distribution transformer 200*b*, the first current sensor 102*g* may be positioned around a primary output terminal 204*b* of the distribution transformer 200*b*. Similarly, for the purpose of sensing the secondary output current flowing from the distribution transformer 200*b*, the second current sensor 102 may be positioned around a secondary output terminal 206, 208, 210 of the distribution transformer 200*b*. Each current sensor 102, 102*g* may be a Rogowski coil.

In further alternative embodiments of the present disclosure, a processor 302, 504, 1216 may perform a method for detecting a fault in a distribution transformer 200 of a power transmission system 400. The processor may be a processor 1216 forming part of a distribution transformer monitor 504 installed at or near one of the distribution transformers 200 of the power transmission system 400. Alternatively or additionally, the processor may be part of a remote computing device or system 302, such as a cloud server, in communication with distribution transformer monitors 504 or other sensors installed at or near the distribution transformers 200 in the power transmission system 400.

In accordance with the exemplary method, the processor 302, 504, 1216 receives an output of a current sensor (e.g., current sensor 102*h*) over time, where the current sensor 102, 102*h* is positioned to sense one of a primary output current flowing from the distribution transformer (e.g., distribution transformer 200*c*) and a secondary output current flowing from the distribution transformer 200*c*. The processor 302, 504, 1216 generates a time-varying output signal representing the received output of the current sensor 102, 102*h*, compares the time-varying output signal to one or more transformer fault profiles to produce a fault analysis, and generates an alert when the fault analysis indicates a transformer fault condition. Thus, in this embodiment, the fault detection system performs its fault analysis using oscillography. The processor 504, 1216 may communicate the alert over a communication network to a remote server 302 or other processing system. Additionally, the processor 504, 1216 may communicate the time-varying output signal to the remote processing system 302 for generation and display of a waveform 402 on a computer display, wherein the waveform 402 corresponds to the time-varying output signal.

According to an exemplary embodiment in which the current sensor 102*h* is positioned to sense the primary output current flowing from the distribution transformer 200*c*, the processor 302, 504, 1216 may further receive an output of a second current sensor 102 over time, where the second current sensor 102 is positioned to sense the secondary output current flowing from the distribution transformer 200*c*. In this case, the processor 302, 504, 1216 may generate a second time-varying output signal representing the received output of the second current sensor 102, compare the second time-varying output signal to a set of transformer fault profiles corresponding to faults detectable on a secondary side of the distribution transformer 200*c* to produce a second fault analysis, and generate a second alert when the second fault analysis indicates a secondary side transformer fault condition. Again, oscillography is used as part of the second fault analysis.

According to another exemplary embodiment in which the current sensor 120*h* is positioned to sense the primary output current flowing from the distribution transformer 200*c*, the one or more transformer fault profiles includes a set of transformer fault profiles corresponding to faults detectable on a primary output side of the distribution transformer 200*c*, and the alert is generated when the fault analysis indicates a primary side transformer fault condition. In any of foregoing exemplary embodiments, when the current sensor 102*h* is positioned to sense the primary output current flowing from the distribution transformer 200*c*, the current sensor 102*h* may be positioned around a primary output terminal 204*c* of the distribution transformer 200*c*. Similarly, when the current sensor 102 is positioned to sense the secondary output current flowing from the distribution transformer 200*c*, the current sensor 102 may be positioned around a secondary output terminal 206, 208, 210 of the distribution transformer 200*c*.

In the absence of any specific statement herein to the contrary, where the terms "substantially," "generally," "approximately," or "about" are used as modifiers in the present disclosure and any appended claims (e.g., to modify a structure, a dimension, a measurement, or some other characteristic), it is understood that the characteristic, feature, or function may vary by up to thirty percent or that the characteristic, feature, or function may be only partially included.

The terms "include" and "comprise" as well as derivatives thereof, in all their syntactic contexts, are to be construed without limitation in an open, inclusive sense, (e.g., "including, but not limited to"). The term "or," is inclusive, meaning "and/or." The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as "comprises" and "comprising," are to be construed in an open, inclusive sense (e.g., "including, but not limited to").

Reference throughout this specification to "one embodiment" or "an embodiment" or "some embodiments" and variations thereof mean that a particular feature, structure, or characteristic described in connection with the embodiment is included in at least one embodiment. Thus, the appearances of the phrases "in one embodiment" or "in an embodiment" or "in an exemplary embodiment" or "in some embodiments" and so forth in various places throughout this specification are not necessarily or likely all referring to the same embodiment. Furthermore, the particular features, structures, or characteristics disclosed herein may be combined in any suitable manner in one or more embodiments.

As used in this specification and the appended claims, the singular forms "a," "an," and "the" include plural referents unless the content and context clearly dictate otherwise. It should also be noted that the conjunctive terms, "and" and "or" are generally employed in the broadest sense to include "and/or" unless the content and context clearly dictate inclusivity or exclusivity, as the case may be. In addition, the composition of "and" and "or" when recited herein as "and/or" is intended to encompass an embodiment that includes all the associated items or elements and one or more other alternative embodiments that include fewer than all of the associated items or elements.

Except as the context may dictate otherwise, the singular shall mean the plural and vice versa within this disclosure. All pronouns shall mean and include the person, entity, firm, object, component, or element to which they relate. Also, the masculine shall mean the feminine and vice versa.

The various embodiments described above can be combined to provide further embodiments. Additionally, aspects of the disclosed embodiments can be modified, if necessary, to employ concepts and embodiments disclosed in various patents, published applications, and other publications to provide further embodiments.

What is claimed is:

1. A system for detecting a fault in a distribution transformer of a power transmission system, the system comprising:
   a current sensor positioned to sense a primary output current flowing from the distribution transformer; and
   a processor operable to:
      receive an output of the current sensor over time;
      generate a time-varying output signal representing the received output of the current sensor;
      compare at least the time-varying output signal to one or more transformer fault profiles to produce a fault analysis; and
      generate an alert when the fault analysis indicates a transformer fault condition.

2. The system of claim 1, further comprising:
   an analog-to-digital converter operably positioned between the current sensor and the processor, the analog-to-digital converter converting an analog output of the current sensor to the output of the current sensor received by the processor, wherein the output of the current sensor received by the processor is in digital form.

3. The system of claim 1, further comprising:
   a wireless transmitter operably coupled to the processor for transmitting at least one of the time-varying output signal and the alert to a remote processing system.

4. The system of claim 1, wherein the current sensor is positioned around a primary output terminal of the distribution transformer.

5. The system of claim 4, wherein the current sensor is a Rogowski coil.

6. A system for detecting a fault in a distribution transformer of a power transmission system, the system comprising:
   a first current sensor positioned to sense a primary output current flowing from the distribution transformer;
   at least a second current sensor positioned to sense at least one secondary output current flowing from the distribution transformer;
   one or more processors operable to:
      receive an output of the first current sensor over time;
      receive an output of the second current sensor over time;
      generate a first time-varying output signal representing the received output of the first current sensor;
      generate a second time-varying output signal representing the received output of the second current sensor;
      compare at least the first time-varying output signal to a first set of transformer fault profiles to produce a first fault analysis;
      compare at least the second time-varying output signal to a second set of transformer fault profiles to produce a second fault analysis;
      generate a first alert when the first fault analysis indicates a transformer fault condition related to a primary side of the distribution transformer; and
      generate a second alert when the second fault analysis indicates a transformer fault condition related to a secondary side of the distribution transformer.

7. The system of claim 6, further comprising:
   one or more wireless transmitters coupled to the one or more processors for transmitting at least one of the first time-varying output signal, the second time-varying output signal, the first alert, and the second alert to a remote processing system.

8. The system of claim 6, wherein the first current sensor is positioned around a primary output terminal of the distribution transformer and wherein the second current sensor is positioned around a secondary output terminal of the distribution transformer.

9. The system of claim 8, wherein the first current sensor is a Rogowski coil.

10. The system of claim 8, wherein the second current sensor is a Rogowski coil.

11. A method for a processor to detect a fault in a distribution transformer, the method comprising:
receiving an output of a current sensor over time, the current sensor being positioned to sense one of a primary output current flowing from the distribution transformer and a secondary output current flowing from the distribution transformer;
generating a time-varying output signal representing the received output of the current sensor;
comparing the time-varying output signal to one or more transformer fault profiles to produce a fault analysis; and
generating an alert when the fault analysis indicates a transformer fault condition.

12. The method of claim 11, further comprising:
communicating the time-varying output signal over a communication network to a remote processing system for generation and display of a waveform on a computer display, wherein the waveform corresponds to the time-varying output signal.

13. The method of claim 11, wherein the current sensor is positioned to sense the primary output current flowing from the distribution transformer, the method further comprising:
receiving an output of a second current sensor over time, the second current sensor being positioned to sense the secondary output current flowing from the distribution transformer;
generating a second time-varying output signal representing the received output of the second current sensor;
comparing the second time-varying output signal to a set of transformer fault profiles corresponding to faults detectable on a secondary side of the distribution transformer to produce a second fault analysis; and
generating a second alert when the second fault analysis indicates a secondary side transformer fault condition.

14. The method of claim 11, wherein the current sensor is positioned to sense the primary output current flowing from the distribution transformer, wherein the one or more transformer fault profiles includes a set of transformer fault profiles corresponding to faults detectable on a primary output side of the distribution transformer, and the alert is generated when the fault analysis indicates a primary side transformer fault condition.

15. The method of claim 11, wherein when the current sensor is positioned to sense the primary output current flowing from the distribution transformer, the current sensor is positioned around a primary output terminal of the distribution transformer.

16. The method of claim 11, wherein when the current sensor is positioned to sense the secondary output current flowing from the distribution transformer, the current sensor is positioned around a secondary output terminal of the distribution transformer.

17. The method of claim 11, further comprising:
communicating the alert to a remote server.

\* \* \* \* \*